United States Patent [19]

Robinson et al.

[11] Patent Number: 4,733,091
[45] Date of Patent: Mar. 22, 1988

[54] SYSTEMS AND METHODS FOR ION IMPLANTATION OF SEMICONDUCTOR WAFERS

[75] Inventors: Frederick J. L. Robinson, Crawley; Michael T. Wauk, II, Haywards Heath, both of England

[73] Assignee: Applied Materials, Inc., Santa Clara, Calif.

[21] Appl. No.: 774,192

[22] Filed: Sep. 9, 1985

Related U.S. Application Data

[63] Continuation-in-part of Ser. No. 652,020, Sep. 19, 1984, abandoned.

[51] Int. Cl.$^4$ ............................................. G21K 5/08
[52] U.S. Cl. .............................. 250/492.2; 250/443.1; 250/442.1; 118/730
[58] Field of Search ............... 250/440.1, 441.1, 442.1, 250/443.1, 398, 400, 491.1, 492.2, 492.21, 492.3; 118/729, 730, 500, 319

[56] References Cited

U.S. PATENT DOCUMENTS

| | | | |
|---|---|---|---|
| 3,778,626 | 12/1973 | Robertson | 250/492.2 |
| 3,993,018 | 11/1976 | Kranik et al. | 118/52 |
| 4,035,655 | 7/1977 | Guernet et al. | 250/492.2 |
| 4,155,011 | 5/1979 | Märk | 250/492.2 |
| 4,234,797 | 11/1980 | Ryding | 250/492.2 |
| 4,282,924 | 8/1981 | Faretra | 165/80 E |
| 4,383,178 | 5/1983 | Shibata et al. | 250/441.1 |
| 4,453,080 | 6/1984 | Berkowitz | 250/443.1 |
| 4,498,833 | 2/1985 | Hertel | 118/729 |
| 4,580,058 | 4/1986 | Mears et al. | 250/396 R |
| 4,599,516 | 7/1986 | Tzya et al. | 250/443.1 |

OTHER PUBLICATIONS

Aitken, The Design Philosophy for a 200 LV Industrial High Current Ion Implanter, Nuc. Inst. and Meth., 139 (1976), pp. 125–134.
Wittkower et al., Advances in Ion Implanatation Production Equipment, Solid State Tech., Dec. 1975, pp. 41–45.
Burggraaf, Ion Implantation in Wafer Fabrication, Semiconductor International, Nov. 1981, pp. 39–64.
Bird et al., PR-200 Ion Implantation System, J. Vac. Sci. Tech. 15(3), May/Jun. 1978, pp. 1080–1085.
Hanley, Electromagnetic Scanning Systems, Nuc. Inst. and Meth. 189, (1981), pp. 227–237.
Robinson, Ion Implanters Overcoming Current Barriers, Semiconductor Int., Jun. 1979, pp. 45–53.
McCullum et al., PR-30 Ion Implantation System, J. Vac. Sci. Tech. 15(3), May/Jun. 1978, pp. 1067–1069.

*Primary Examiner*—Bruce C. Anderson
*Assistant Examiner*—Paul A. Guss
*Attorney, Agent, or Firm*—Flehr, Hohbach, Test, Albritton & Herbert

[57] ABSTRACT

A dual mechanical movement scanning system for ion implantation includes a radial scan arm which is mounted at a fixed pivot point external to the system vacuum chamber and penetrates the chamber and supports the wafer paddle or wheel within the chamber. The fast-scan component is provided by rotation of the paddle on the support arm; the slow-scan component is provided by pivotal movement of the scan arm itself. The drive system which reciprocally pivots the radial scan arm is configured geometrically so that controlled movement of one arm of the drive system is translated as 1/r velocity of the rotational axis relative to the beam path. The wafer paddle can be constructed to provide a variable implant angle and to use a component of centrifugal force to hold the wafers in place without clamps or other mechanical means.

23 Claims, 19 Drawing Figures

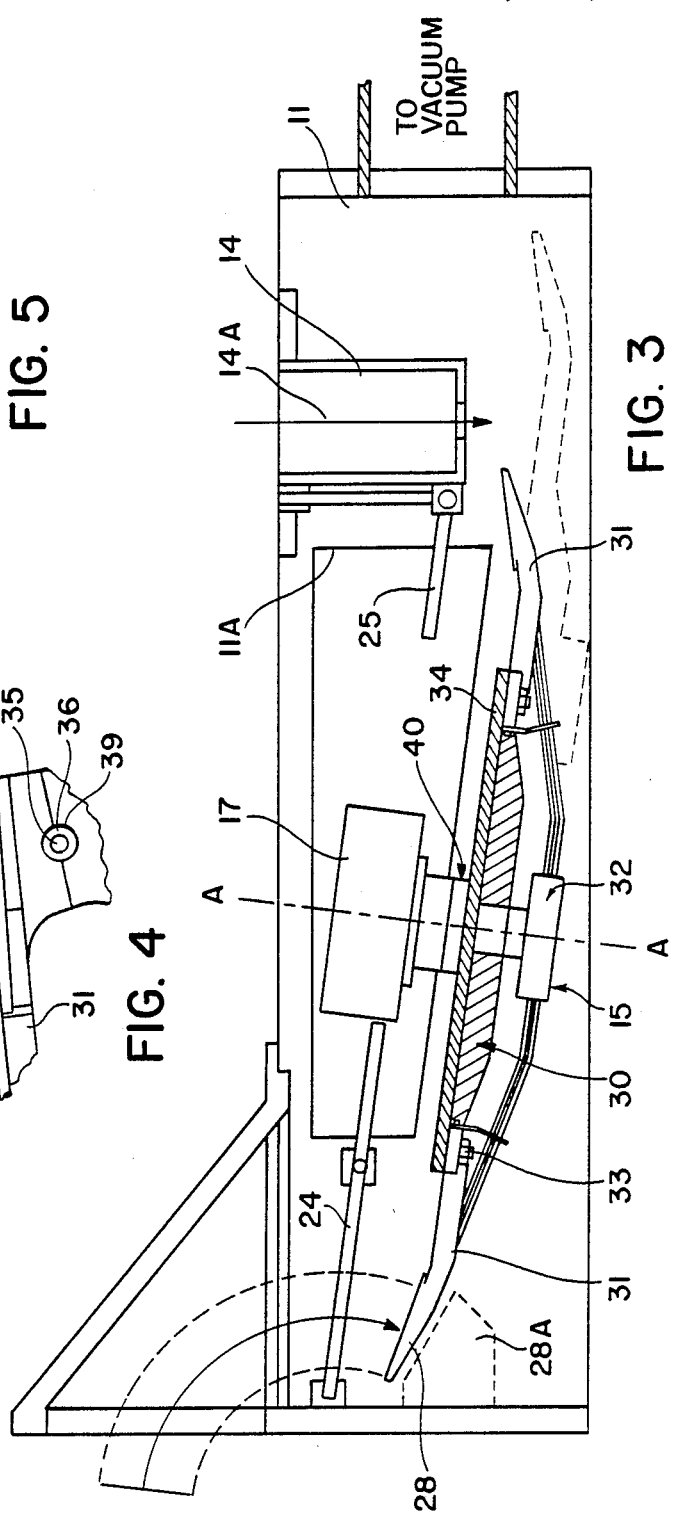
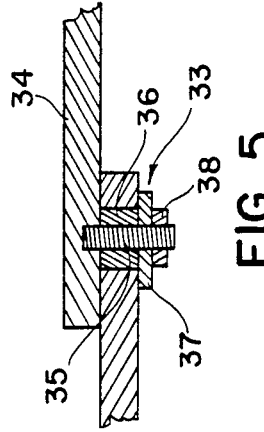
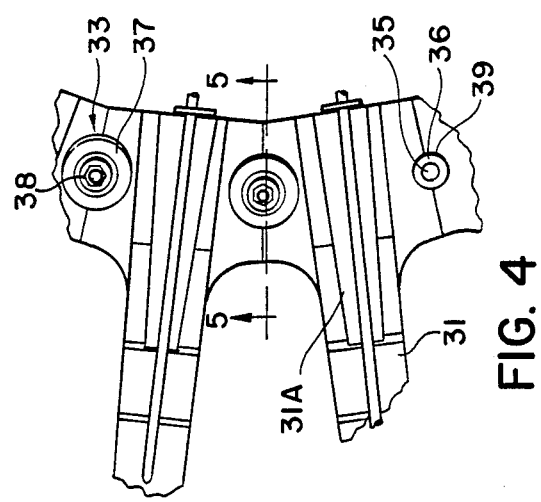

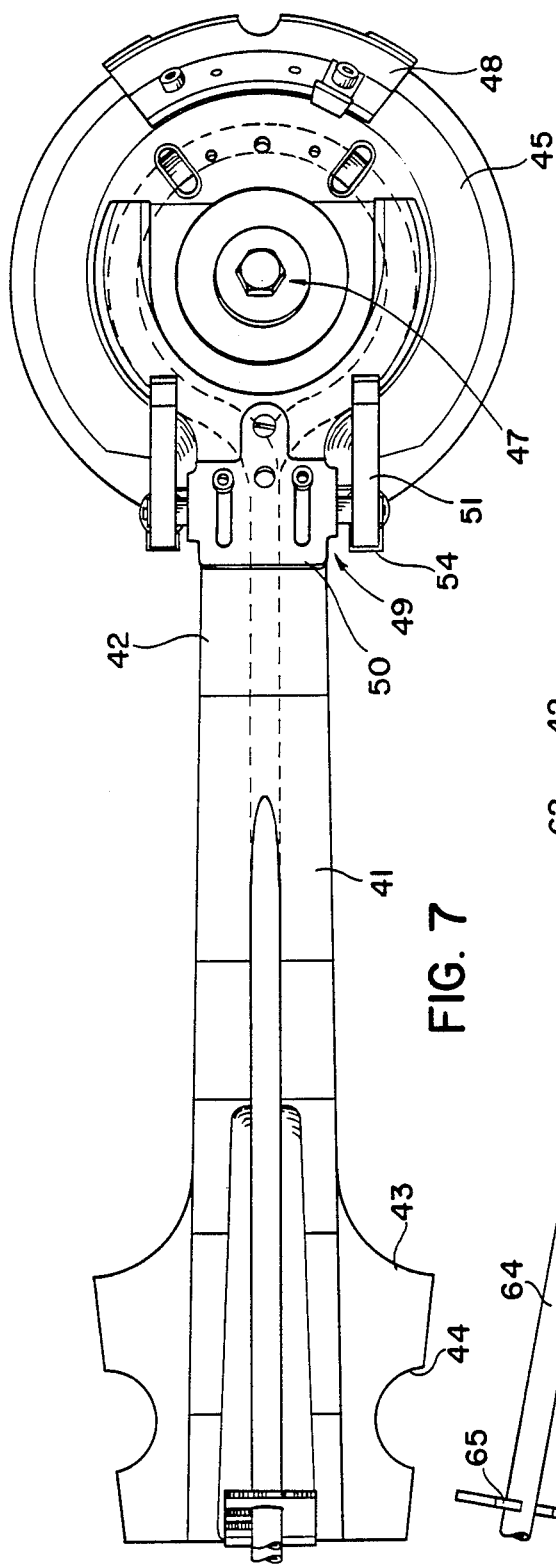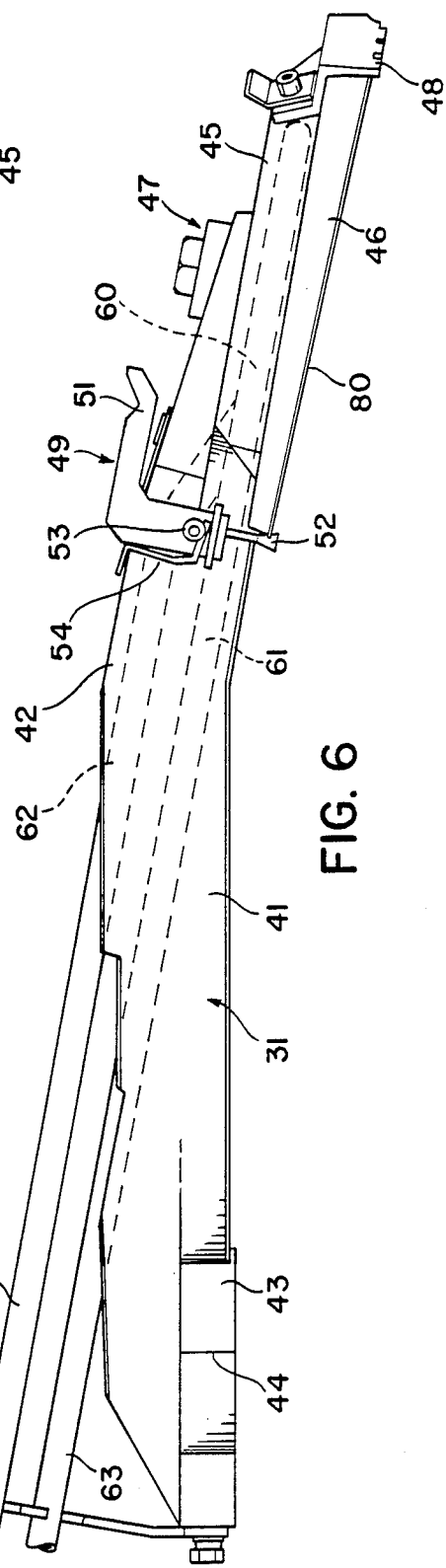

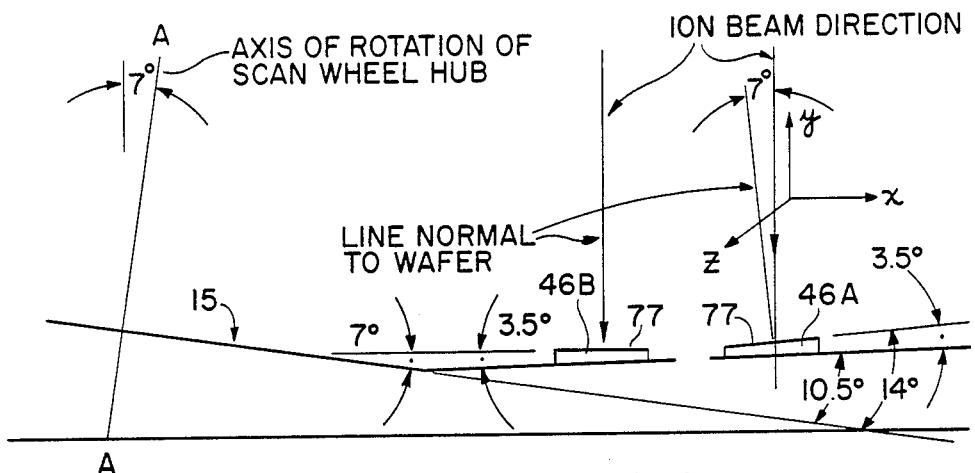
FIG. 13
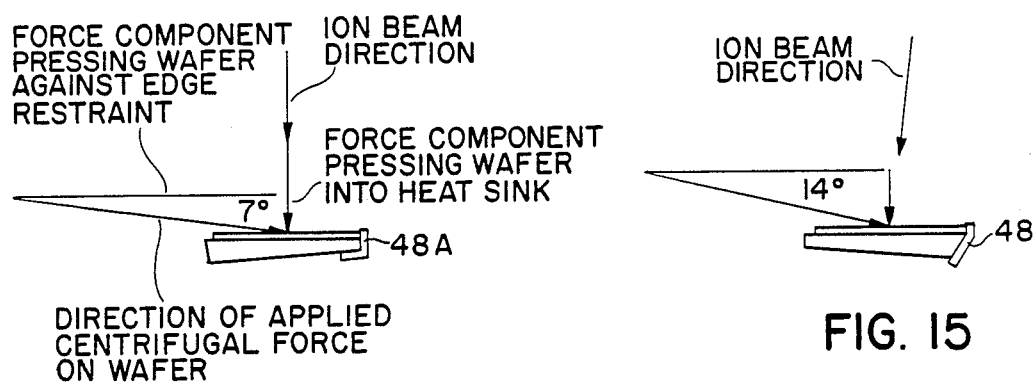
FIG. 14
FIG. 15
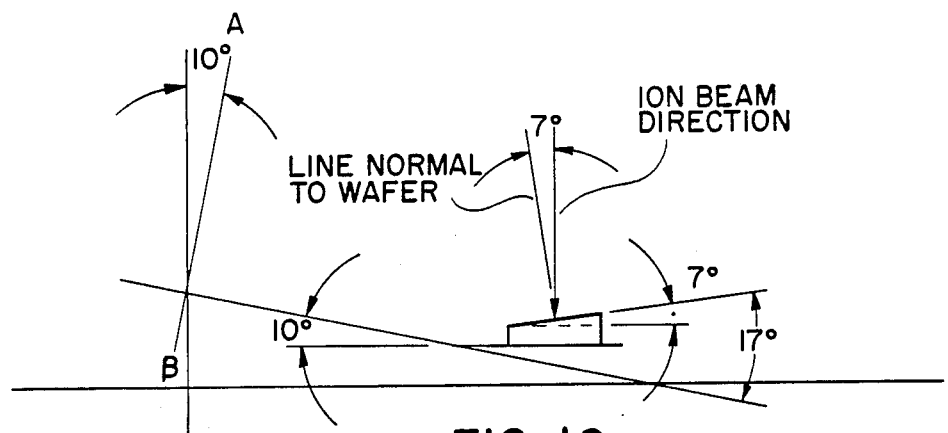
FIG. 16

SYSTEMS AND METHODS FOR ION IMPLANTATION OF SEMICONDUCTOR WAFERS

CROSS REFERENCE TO RELATED APPLICATIONS

This application is a continuation-in-part of U.S. patent application Ser. No. 652,020, filed Sept. 19, 1984 abandoned.

BACKGROUND OF THE INVENTION

This invention relates generally to systems and methods for implanting ions of preselected chemical species into semiconductor wafers and, specifically, to positioning and scanning the semiconductor wafers relative to the ion beam. More specifically, this invention relates to three interrelated aspects of the technology of wafer handling in ion implantation systems capable of producing high beam currents, e.g., boron ion beams in excess of ten milliamperes and arsenic ion beam in excess of thirty-five milliamperes. The three aspects relate to wafer mounting or clamping on a heat sink, scanning wafers through the ion beam, and orienting wafers relative to the ion beam during scanning.

DISCUSSION OF BACKGROUND AND PRIOR ART

The manufacture of large scale integrated circuit (LSIC) chips has become one of the most important industries in the world over the last ten or fifteen years. This technology has produced the dramatic improvement in performance/cost of both mainframe and minicomputer systems and the microcomputer systems which are proliferating in the home computer and professional office computer field. LSIC technology has also made significant advances in performance and cost reduction in telecommunications and real time control system for industrial processes and equipment. To understand the importance of this invention in the LSIC field, some background information on integrated circuit (IC) manufacture will be helpful.

USE OF ION IMPLANTATION IN SEMICONDUCTOR PROCESSING

Very great improvements in the scale of integration of semiconductor devices on IC chips and the speed of operation of such devices have been achieved over the past several years. These improvements have been made possible by a number of advances in IC manufacturing equipment as well as improvements in the materials and methods utilized in processing virgin semiconductor wafers into IC chips. The most dramatic advances in manufacturing equipment have been improved apparatus for lithography and etching and improved systems for implanting ions of conductivity modifying impurities into semiconductor wafers.

The density of integrated circuits and their speed of operation are dependent largely upon the accuracy and resolution of the lithography and etching systems used to form patterns of circuit elements in masking layers on the semiconductor wafer. However, density and speed are also dependent upon tight control of the profile of doped regions in the wafer, i.e., regions in which substantial concentrations of conductivity modifying impurities have been added. Tight control of wafer doping can best be achieved using ion implantation techniques and equipment. The uniformity of doping achievable only with ion implantation is critical in the fabrication of smaller geometry devices. Doping uniformity across individual wafers and repeatability of the doping level and uniformity from wafer to wafer, which is achievable with ion implantation, dramatically improves fabrication yields of high density devices.

DESIRABLE FEATURES OF ION IMPLANTATION SYSTEMS

One of the strong desiderata in the field of manufacturing LSIC devices using ion implantation techniques is to improve the wafer throughput capability of the ion implanter without dramatically increasing the cost of performing the implants, especially the cost of performing heavy dose implants, which are becoming more popular in the LSIC manufacturing process. The principal parameter which determines wafer throughput in an ion implanter, especially in the heavy implant cycle of the system, is ion beam current. The present generation of ion implanters involve a number of different systems of widely varying ion beam current generating capacity, with systems generally being categorized as low current, medium current and high current machines.

This invention is particularly directed to meeting performance challenges involved in high current ion implantation systems. High current ion implantation machines in the parlance of the current state of the art are considered to be machines which generate useful boron ion beam currents of 2–3 milliamperes (mA) and about 10–12 mA of arsenic ion beam current. Beam currents at 10 mA and above, with beam energies as high as 150 kilovolts, create special problems for the technology of wafer handling in all the areas mentioned above.

To achieve even greater manufacturing efficiency, the semiconductor manufacturing industry is looking to develop even higher beam current ion implantation systems to increase wafer throughput for high dose implants. A copending and commonly assigned U.S. patent application of Derek Aitken entitled APPARATUS AND METHODS FOR ION IMPLANTATION, U.S. application Ser. No. 641,027, filed Aug. 15, 1984 (now U.S. Pat. No. 4,578,589, issued Mar. 25, 1986), discloses ion beam line technology capable of generating useful ion beam currents several times greater in magnitude than current commercial state of the art technology. More specifically, boron ion beam currents in excess of 10 mA and arsenic ion beam current in excess of 30 mA are achievable utilizing the novel ion optics technology and ion beam line component technology disclosed in the Aitken application. This technology will herein be referred to as the Aitken very high current beam technology.

Ion beam currents at these levels will result in a new generation of ion implantation apparatus which will dramatically improve wafer throughput. These ion beam currents can be developed at ion beam energies of up to about 150 kilovolts (kV). Ion beams having these current levels and energy levels involve a total beam power over four kilowatts. Such high power ion beams produce special additional challenges relative to scanning, mounting, orienting and cooling of the wafers during the ion implantation process. Specifically, such high power beams place severe requirements on wafer handling and scanning in full batch ion implantation system, which must meet the following specifications to satisfy advanced requirements of the semiconductor industry:

(1) Scanning a full twenty-five unit batch of six inch diameter semiconductor wafers simultaneously;

(2) Maintaining uniformity of dose at less than about 0.75% variation across the wafers and from batch to batch;

(3) Keeping maximum wafer temperature less than eighty degrees Centigrade to avoid distortion of the photoresist pattern;

(4) Avoiding implant angle variation from one edge of the wafer to the other or from center to edge;

(5) Avoiding wafer contamination and cross-contamination from other species which produces yield loss;

(6) Avoiding mechanical or thermal stress damage to the wafer;

(7) Facilitating total automation of wafer loading and unloading operation of the wafer scanning system.

The current state of the art techniques for wafer handling and scanning in ion implantation systems involve limited technology capabilty. Such systems have difficulty meeting the performance requirements of present day high current ion implantation systems. They are inadequate for meeting the design and performance challenges of next generation ion implantation systems having ion beam power levels of the type produced by the Aitken very high current beam technology.

The prior art contains a wide variety of teachings of systems and methods for scanning wafers through an ion beam and for mounting the wafers on heat sink elements associated with the scanning mechanism.

For high beam currents and high power beams, it is well known that it is essential for the wafers to be scanned mechanically through the beam at relatively high velocity in one direction, i.e. the fast scan direction. For the other direction of scan, it is known both to use a slow mechanical scan of the wafers or to use an electrostatic or electromagnetic scan of the beam itself.

Various systems and methods have been utilized to mount and hold the wafers on the scanning wheel or drum and to provide the necessary cooling of the wafers by effective heat sink mounting with good thermal contact between wafer and heat sink. Most of the proir art systems utilize a clamping arrangement which the wafer against the heat sink by clamping at the edge of the wafer. It has been known to employ centrifugal force to urge the wafer against the heat sink to maintain good thermal contact of the entire wafer surface against the heat sink.

In some systems care has been taken to eliminate bearings and lubricants from the vacuum chamber to avoid wafer contamination, but in the process expensive and complex mechanisms for moving large portions of the system, such as the whole process chamber have been utilized.

Interchangeable wheels and interchangeable heat sink elements have been suggested or used to provide for alteration of the implant angle from an off angle of about seven degrees to a zero degree implant angle. Generally these approaches have involved complex mounting schemes which have made the use of alternative implant angles in a single machine expensive to implement and difficult to use.

None of the systems for wafer mounting, cooling, and scanning which have been taught or suggested in the prior art could succeed in meeting all of the design challenges listed above for high current implanters and especially the beam power which is enables by the Aitken super high beam current technology discussed above.

SUMMARY OF THE INVENTION

It is the principal object of this invention to provide improved systems and methods for ion implantation of semiconductor wafers.

It is another object of this invention to provide improved systems and methods for scanning semiconductor wafers through a high current, high power ion beam.

It is a particular object of this invention to provide an improved wafer scanning system capable of scanning a full batch of twenty five semiconductor wafers of six inch diameter.

It is another object of this invention to provide an improved wafer scanning and cooling system which is capable of handling ion beam power of at least four kilowatts without adverse affect on the semiconductor wafers.

It is another object of this invention to provide an improved wafer mounting and scanning system which is capable of retaining the wafers on the heat sinks during scanning without use of any clamping mechanisms in contact with the front face of the wafer.

It is another object of this invention to provide an improved system for mounting wafer on heat sink elements of a wafer scanning mechanism with different implant angle orientation to the ion beam.

It is another object of this invention to provide an improved system and method for accomplishing dual mechanical scanning of wafers relative to an ion beam with simplicity and low cost.

One aspect of this invention features a system for scanning semiconductor wafers through an ion beam in a dual scanning motion. The system includes an ion beam line system generating an ion beam oriented in a prearranged direction defining one axis of a rectangular coordinate system relative thereto. A scan wheel assembly carries a plurality of semiconductor wafers and has a central axis about which it can resolve. A drive arrangement rotates the scan wheel assembly about the central axis to scan the wafers across the beam in one coordinate direction. A scan arrangement produces relative scanning movement between the scan wheel and the ion beam in another coordinate direction. The scan wheel assembly comprises a central hub, a plurality of separate spoke arms mounted to the hub and extending radially outward therefrom, and a plurality of cylindrical heat sink elements, each formed on the outer end of one of the spoke arms and including an arrangement for mounting a semiconductor wafer thereon. The spoke arms each have a width substantially less than the maximum width of the heat sink elements. The scan arrangement produces a distance of scanning movement such that the heat sink elements and associated spoke arms are entirely out of the ion beam at one end of the scanning movement and only a portion of the spoke arms are in the ion beam at the other end of the scanning motion.

Preferably, each of the heat sink elements defines a cooling fluid channel extending therethrough. The scan wheel assembly includes piping arrangement coupling cooling fluid to and from each of the cooling fluid channels in the heat sink assemblies to carry heat generated by the ion beam away therefrom. Each of the heat sink inserts comprises a conductive metal body defining a first mounting surface adjacent the heat sink assembly and a second second mounting surface facing the ion beam. A first layer of conductive elastomeric material is mounted to the first mounting surface, and a second layer of conductive elastomeric material is mounted on the second mounting surface to serve as the wafer mounting surface. The heat sink insert provides good thermal conductivity to the cooled heat sink assembly across the entire surface of a wafer mounted thereon.

This feature of the invention enables the wafer scanning system to handle a full batch of twenty five wafers on the individual heat sink elements and to handle beam power loads of four kilowatts or more. The structure of the scan wheel assembly is such that the ion beam strikes the assembly and wafers mounted thereon only a fraction of the time. This greatly reduces the integrated heat load on the scan wheel assembly and enables a relatively simple but effective cooling water system to provide sufficient wafer cooling to maintain wafer temperature below the damage threshold level.

Another aspect of this invention features a scan wheel assembly and mounting drive arrangement which facilitates using centrifugal force to hold the wafers on the heat sink during scanning without the use of any clamping mechanism when the scan wheel assembly is revolving at high angular velocity. The arrangement provides for such centrifugal force holding even when the implant angle of the beam on the wafer is zero degree.

The drive arrangement used in this aspect of the invention comprises a mounting drive arrangement for mounting the scan wheel assembly with the central axis generally parallel to the direction of the ion beam but canted at a slight angle toward the origin of the ion beam in a plane defined by the central axis and the one coordinate axis and for rotating the scan wheel assembly at high rotational velocity about the central axis to scan the wafers across the beam in one coordinate direction. Each of the heat sink elements defines a mounting surface region and is spaced a prearranged distance from the central axis. Each of the wafer mounting arrangements comprises a heat sink insert mounted to the heat sink element and defining a wafer mounting surface having a diameter at least as large as a prearranged size of semiconductor wafer to be carried thereon and being oriented at a prearranged angle relative to the one coordinate axis such that a line normal to the wafer mounting surface in the plane defined by the central axis and the one coordinate axis is either parallel to the one coordinate axis or is canted at a small angle to the one coordinate axis. In either event the normal line to the wafer intersects the central axis to define a large acute angle. With this orientation between the wafer and the axis of rotation of the scan wheel assembly rotation of the scan wheel assembly at a high rotational velocity produces a substantial component of centrifugal force normal to the wafer mounting surface so that a wafer thereon is held tightly against the mounting surface.

Preferably each of the heat sink elements defines a wafer stop surface adjacent the heat sink insert at the outermost radial point thereon to restrain the wafer on the wafer mounting surface when the scan wheel assembly is in rotation. A wafer clamping arrangement is mounted on the heat sink element for temporarily urging a wafer on against the wafer stop surface when the scan wheel assembly is not rotating at high rotational velocity. This wafer clamping arrangement preferably includes a pair of clamp fingers mounted to the heat sink element on a side opposite the wafer mounting surface with a spring biasing arrangement urging the clamp fingers against an edge of the wafer and an inertial arrangement opposing the spring biasing when the scan wheel assembly is rotating at high velocity to retract the clamp fingers away from the edge of the wafer.

In this manner the wafer is retained on the wafer mounting surface solely by the component of centrifugal force normal to the wafer during the implanting process.

The centrifugal force wafer holding feature of this invention provides the advantage of good thermal heat conduction between wafer and heat sink but without any clamp arrangement surrounding the edge portion of the wafer to be a source of sputtered contamination from the material of the clamp or previously implanted species that have entered the material of clamp. It also eliminates a source of contamination produced by flaking of photoresist where the clamp contacts the edge portion of the wafer surface.

Another aspect of this invention features a system for scanning semiconductor wafers through an ion beam in a vacuum chamber in which no translational sealing arrangements between air and vacuum are required. An ion beam system generates an ion beam and directs it into the vacuum chamber in a prearranged direction defining one axis of a rectangular coordinate system. A scan wheel assembly carrying a plurality of semiconductor wafers and having a central axis is provided. A mounting drive arrangement mounts the scan wheel assembly in the vacuum chamber with the central axis oriented substantially parallel to the one axis, rotates the scan wheel assembly about the central axis, and translates the scan wheel assembly relative to the ion beam substantially in the direction of a second axis of the coordinate system to produce a two dimensional scan of the semiconductor wafer through the ion beam.

The mounting drive arrangement comprises a scan arm disposed within the chamber and a rotational mounting arrangement for mounting the scan wheel assembly at one end of the scan arm for rotation about the central axis. A first drive arrangement rotates the scan wheel assembly. A second mounting arrangement for mounts the scan arm at the other end thereof for rotation about an axis generally parallel to the one axis defined by the ion beam direction. This second mounting arrangement includes a shaft attached at one end to the scan arm and extending through a wall of the vacuum chamber. A bearing arrangement external to the chamber journals the shaft arrangement for rotation. A second drive arrangement rotates the shaft in the bearing. A vacuum sealing arrangement cooperatively mounted between the vacuum chamber wall and the shaft arrangement provides a rotary vacuum to air shaft sealing arrangement.

The preferred embodiment of this invention utilizes a unique approach to driving the scan arm to simplify the drive and control arrangement to achieve a velocity of slow scan through the ion beam which varies inversely with the active radius of the scan wheel, i.e. the distance from the center of the scan wheel to the center of the ion beam. Basically, this approach takes advantage of a congruent triangle position and drive arrangement which simplifies the drive to a linear drive and simplifies the control of the drive to a linear tracking of distance and control over velocity with a simple circuit arrangement.

The axis of the ion beam I the central axis of the scan wheel assembly A and the axis of the second mounting means B define a triangle having two fixed sides BA and BI and a third side AI which varies in length as the scan arm scans back and forth across the beam. The second drive arrangement drives the scan arm so that the rate of change of the distance AI varies inversely with the magnitude of the distance AI, including a pivot arm mounted at one end to the shaft and a linear drive means mounted for rotation about an axis E and attached to the other end of the pivot arm at a point D so that the linear drive means translates the other end of the pivot arm toward the axis E. The positions of the axis E and the point of attachment D are preselected such that the points B, D, and E define a triangle BDE which is congruent to the triangle BAI. The second drive arrangement further includes a tracking arrangement for signalling the distance DE as the linear drive means moves the pivot arm, and a drive control arrangement for controlling the rate of drive of the linear drive means as a function of the inverse of the signalled distance DE so that the rate of change of the distance DE varies inversely with the magnitude of the distance DE and, because of triangular congruency, the corresponding rate of change of the distance AI varies inversely with the magnitude of the distance AI.

The first drive arrangement can utilize an electric motor housed within the scan arm itself. Alternatively, the electric motor can be mounted outside the vacuum chamber and the rotational drive mechanism can be provided by making the shaft which rotates the scan arm a hollow shaft in which a drive shaft is journaled and rotated by an external motor. This drive shaft in turn drives a belt or chain drive arrangement to transmit power from the lower shaft to a shaft journaled to the scan arm at the upper end to drive the scan wheel assembly.

This arrangement utilizes only rotary vacuum sealing arrangements, preferably of the ferro-fluidic rotating seal type which ensure reliable sealing around a rotating shaft. All lubricated surfaces are outside the vacuum chamber and no expensive and complex sliding seal arrangements are required.

When all of the various features of this invention are combined into a wafer scanning system, all of the desirable specifications for such a system as set forth above can be readily met. The system is capable of handling the beam power produced by the Aitken super high beam current technology. The scan wheel assembly can be formed with highly modular components for ease of repair and replacement. The scan wheel assembly can readily be interfaced with a wafer loading system which hands off wafer to the individual heat sink inserts and clamp arrangements using a mechanism that withdraws the temporary clamp fingers until the wafer is in contact with the heat sink insert.

Other objects, features and advantages of this invention will be apparent from a consideration of the detailed description of the invention given below in conjunction with the accompanying drawings.

BRIEF DESCRIPTION OF THE DRAWING FIGURES

FIG. 3 is a partly sectioned top view of a wafer scanning system according to this invention.

FIGS. 4 and 5 are fragmented plan and section views showing mounting arrangements for heat sink assemblies in a wafer scanning system according to this invention.

FIGS. 6-8 are top, back and front view of a heat sink assembly for a scan wheel assembly according to this invention.

FIGS. 13-16 are diagrams useful in explaining the principles of operation of a wafer scanning system according to this invention.

DETAILED DESCRIPTION OF EMBODIMENTS OF THE INVENTION

Figure 1:
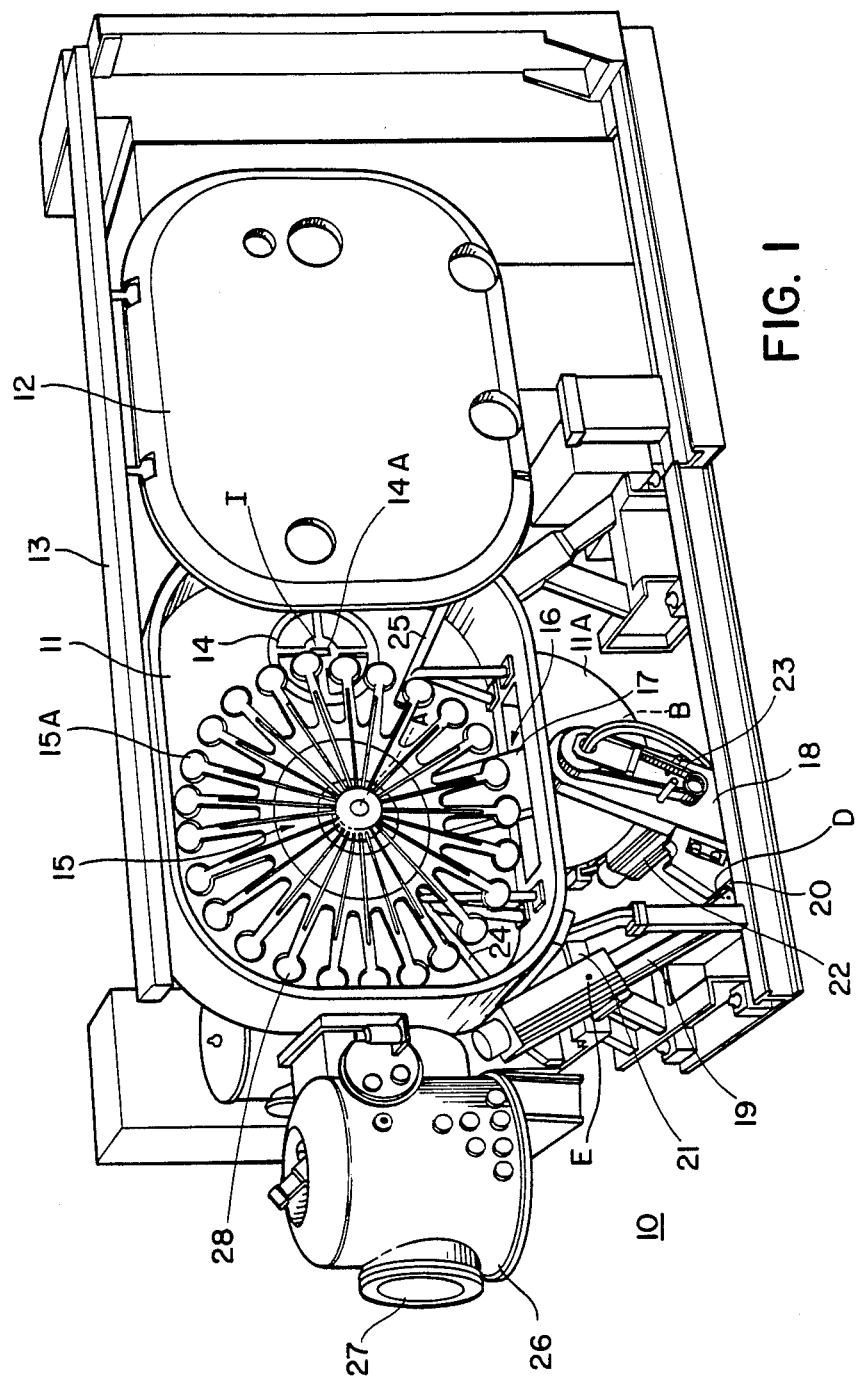
FIG. 1 is a perspective view of an ion implantation system incorporating a wafer scanning system according to this invention.

FIG. 1 depicts an ion implantation system 10 which includes a wafer process chamber 11 having a sliding front door 12 carried on an overheat track 13 and having sealed view ports therein. When slid into position over the chamber 11, the door 12 completes a vacuum chamber. Appropriate vacuum seals and gripping arrangements (not shown) hold the door 12 tightly against the side walls of the process chamber. Vacuum pumping apparatus (not shown) communicates with the interior of vacuum chamber 11 to pump down the chamber and provide the evacuated atmosphere required for effective ion implantation. An ion beam generating and analyzing system communicates an ion beam to the vacuum chamber through a post-acceleration system 14 which extends through the back of the vacuum chamber 11. The ion beam generating and analyzing system is preferably the one shown in the above referenced Aitken application.

A scan wheel assembly 15 is mounted within the vacuum chamber 11. The scan wheel assembly 15 includes twenty-five wafer mounting paddles 15A arranged in a circular array around a central hub. The details of the scan wheel assembly will be described below. Scan wheel assembly 15 is mounted for high velocity rotation about its central axis and for rotational precession about an axis at the bottom of the scan arm assembly 17 which extends into a well 11A at the bottom of the vacuum chamber.

A mounting and drive arrangement 16 mounts the scan wheel assembly 15 in the vacuum chamber 11 and includes the various mounting arrangements and drive arrangements for accomplishing the dual rotational and precessional scan of the scan wheel assembly. The main elements of the mounting and drive arrangement 16 are scan arm 17 which is directly coupled to drive arm 18, which is driven by a motor and lead screw drive arrangement 19. A ball type coupling 20 couples the drive arm 18 to the translating carriage (not shown) of lead screw drive arrangement 19. Drive arrangement 19 is mounted for rotation to a bracket 21. A motor 22 mounted to the drive arm 18 drives a belt drive transmission arrangement 23 which includes a belt drive arrangement (not shown) mounted within hollow scan arm housing 17 to provide the drive for rapid rotation of the scan wheel assembly 15.

Stop brace assemblies 24 and 25 mounted within the vacuum chamber 11 limit the precessional scan position of the scan wheel assembly 15 when the drive arm arrangement 18 is decoupled from the lead screw drive arrangement 19.

A wafer handling and loading arrangement is provided within a separate chamber 26 which includes a load lock door 27 for convenient interfacing to a wall of a semiconductor process clean room. The wafer loading system includes an arrangement for transferring wafers to and from a heat sink paddle located at the position designated 28 to a standard wafer cassette. A preferred form of wafer handling and loading arrangement is disclosed in copending and commonly assigned Stonestreet et al. U.S. patent application Ser. No. 774,209 filed Sept. 9, 1986 and entitled Systems and Methods for Wafer Handling in Semiconductor Process equipment.

FIGS. 2-5 show certain structural details of the scan wheel assembly 15 and other details will be shown and discussed in connection with other drawing figures. Scan wheel assembly 15 comprises a central hub assembly 30 which carries thereon a plurality of separate heat sink assemblies 31 and a cooling fluid supply arrangement 32. Mounting arrangements 33 mount the individual heat sink assemblies 31 to the back plate 34 of the hub assembly 30. Hub assembly 30 is mounted for rotation about its central axis A by a combined shaft, bearing and rotary vacuum seal arrangement 40 which provides for rotation of the scan wheel assembly relative to the scan arm assembly 17. The details of this arrangement are shown in other drawing figures and discussed below.

FIGS. 4 and 5 illustrate a preferred arrangement for mounting the individual heat sink assemblies 31 to the back plate 34 of the hub assembly 30. Each of the individual sink assemblies 31 includes a mounting flange 31A which has on each side a semicircular cutout 39 serving as a fixturing element relative to mounting collars 36 which are mounted on the back plate 34. In this manner, each of the individual heat sink assemblies 31 is precisely located on the back plate 34 and held in position for fastening. Threaded studs 35 extend through locating collars 36. A flat washer 37 is mounted over the threaded stud 35 and a nut 38 is threaded over the stud 35 and tightened down onto the washer 37. It will be appreciated that this mounting arrangement provides for very accurate fixturing of the individual heat sink assemblies 31 on the back plate 34 and secure mounting thereof in an easily removable and replaceable fashion for maintenance and service.

Figure 9:
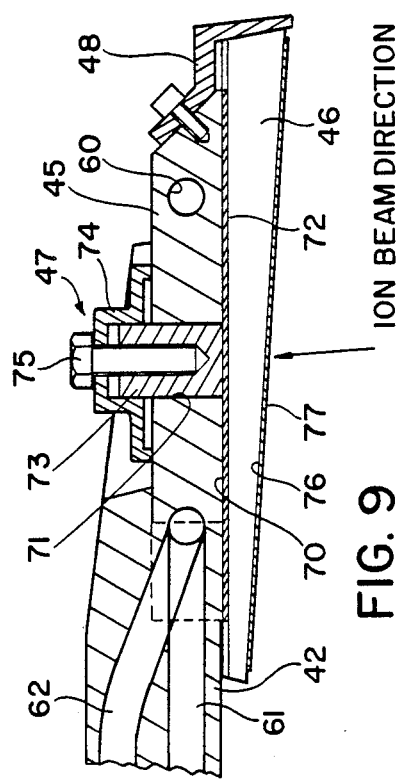

Referring now to FIGS. 6-10, the detailed construction and arrangement of the individual heat sink assemblies 31 will be described. Each of the heat sink assemblies 31 includes a first spoke arm section 41 and a second spoke arm section 42 extending at a slight angle to the spoke arm 41. At the back end of the spoke arm arrangement is a mounting flange 43 having semicircular mounting apertures 44 which mount to the scan wheel back plate as described above. At the outer end of spoke arm section 42 is a heat sink paddle 45 which is generally circular and carries thereon a heat sink insert 46 fastened thereto with a fastening arrangement 47, the details of which are shown in FIG. 9 and described below. As shown in FIG. 7, each of the spoke arms sections 41 and 42 has a width in the plane orthogonal to the ion beam which is substantially less than the diameter of the heat sink paddle. A wafer edge restraint 48 is mounted to the heat sink paddle 45 at the outer end and cooperates with the heat sink insert 46 and a wafer clamp arrangement 49 to hold a semiconductor wafer 80 on the front surface of the heat sink insert 46 when the scan wheel assembly is at rest or accelerating to high rotational motion.

Wafer clamp assembly 49 comprises an adjustable bracket 50 which mounts to the spoke arm section 42 and carries a pair of inertial actuator arms 51 and a wafer clamp element 52 mounted for rotation about axles 53. A spring element 54 on axle 53 urges the clamp element 52 against the edge of the wafer 80. Under high centrifugal force, produced during fast rotational scan, the inertial actuator element 51 will rotate outward and move the clamp element 52 away from the edge of the wafer 80. Because the centrifugal force on the actuator element 51 is substantially greater than the centrifugal force on the clamp element 52, the inertial actuator 51 will rotate about the axle 53 and carry the clamp element 52 away from the edge of the wafer. In this manner the clamp element 52 will not interfere with ion implantation of the wafer. The wafer will be held on the heat sink insert 46 by centrifugal force as will be described below. The clamp element 52 will be located, during actual ion implantation, in a position such that it is unlikely that any sputtered contaminants or cross-contaminants emitted therefrom would have a line of sight to the front surface of the wafer 80.

Wafer edge clamp assembly 49 cooperates with a mechanical actuator arrangement 28A shown in FIG. 3 mounted at the wafer transfer position 28 to retract and release the wafer clamp arrangement during wafer loading and unloading. The mechanical actuator arrangement can be of any suitable design which includes means for pushing on and releasing the inertial actuator arms 51 to retract and then release the clamp elements 52 from the edge of the wafer 80.

A heat sink cooling channel 60 is formed within the heat sink paddle 45 and communicates with an inlet channel 61 and an outlet channel 62 in the spoke arm sections 41 and 42. Inlet tube 63 communicates cooling fluid to the inlet channel 61 and outlet tube 64 couples the return fluid out of outlet channel 62. Inlet tube 63 and outlet tube 64 communicate fluid to and from a cooling fluid header assembly located at the hub of the scan wheel assembly, as will be described below. A bracket assembly 65 supports the inlet and outlet tubes 63 and 64 at the back end of the heat sink assembly 31. The bracket 65 counteracts any centrifugal force on the inlet and outlet tubes to preclude any substantial stress thereof at points where they are joined and sealed into the spoke arm 41 during high rotational velocity of the scan wheel assembly.

FIG. 9 illustrates the structure and arrangement of the heat sink insert 46 and, in particular, the details of the mounting arrangement 47. Heat sink insert 46 comprises a cylindrical disk-shaped element formed from a conductive metal. A mounting surface 70 on the heat sink paddle 45 has a generally circular sheet of thermally conductive elastomer material 72 mounted thereto to provide good thermal conduction between the heat sink insert 46 and the heat sink paddle 45. A stud 73 is mounted on the back of the heat sink insert 46 and is received in an aperture 71 in the heat sink paddle 45. A standoff washer 74 and threaded bolt 75 cooperate with an internally threaded hole in the stud 73 to mount heat sink insert 46 to the front face 70 of the heat sink paddle 45. Tightening the stud 75 pulls the back face of the heat sink insert 46 into compression contact with the conductive elastomer 72 to insure that good heat transfer is achieved across those surfaces. A conductive elastomer sheet 77 is mounted to the front surface 76 of the heat sink insert 46. This thin sheet of conductive elastomer provides good thermal coupling between the heat sink insert 46 and a semiconductor wafer carried on the mounting surface defined by the front surface of the elastomer sheet 77.

The combination of a substantial flow of cooling fluid, which can for this purpose be cooled water, through the cooling channel 60 in the heat sink paddle 45 and good thermal coupling between the heat sink insert 46 and the heat sink paddle 45 provides highly effective cooling of a semiconductor wafer mounted on the surface of the elastomer pad 77. As will be described in more detail below, the wafer mounting surface of the heat sink insert 46 is preferably inclined at a 3½ degree angle to the mounting surface 70 of the heat sink paddle 45. The combination of this angle and the angle of the heat sink paddle 45 to the spoke arm 41, together with the canting of the axis A—A of the scan wheel assembly 15, provides a substantial component of centrifugal force which presses a wafer on the elastomer mounting surface 77 during high rotational velocity of the scan arm assembly. This assures that, across the whole back surface of the wafer, good thermal contact is provided between the wafer and elastomer surface so that heat generated in the wafer by the ion beam will be effectively and efficiently conducted away in series through the heat sink insert 46, the elastomer layer 72, and the heat sink paddle 45 into the cooling fluid flowing through cooling channel 60. Preferably, the flow of cooling fluid is turbulent for high transfer efficiency.

The efficiency of cooling of wafers mounted on the conductive elastomer 77 during implantation and other features of this invention permit the system of this invention to effectively maintain wafers at a temperature below 80 degrees Centigrade under conditions when the ion beam power striking the wafer is eight kW. This cooling efficiency precludes any thermal damage to the semiconductor wafer or any thermal distortion of photoresist pattern formed on the surface of the semiconductor wafer to define the regions of the wafer surface which are implanted with the chemical species of the ion beam.

Effective cooling of the semiconductor wafer under eight kW beam power is only achievable because of the design of the heat sink assembly 71 with spoke arm sections 41 and 42 which are substantially more narrow than the diameter of the heat sink paddle and insert. As shown in FIG. 3, the individual heat sink assemblies 31 are scanned in the slow scan direction through the ion beam 14A with overscan on both ends of the scanning cycle. When the scan are assembly 15 is fully scanned to the right, the wafers mounted on the heat sink inserts are completely out of the influence of the ion beam. Similarly, when the scan wheel assembly 15 is in its left-most position, the wafer is entirely out of the ion beam on the other side. In the right-hand overscan position shown in FIG. 3, the ion beam is, of course, striking the heat sink assemblies 31 on the spoke arm regions adjacent the wafers. However, as is apparent from FIGS. 1 and 2, the total surface area of the scan wheel assembly presented to the ion beam in this overscan position is only a small fraction of the total circular area of the scan wheel assembly. Most of the time the ion beam is simply passing between the individual spoke arms of the heat sink assemblies. During the time that the beam is simply passing through this open region, it is not heating the scan wheel assembly.

Accordingly, the spoke arm and heat sink paddle arrangement of this invention substantially reduces the overall heat load on the scan wheel assembly during the dual scan ion implantation process. It will further be appreciated that as the individual heat sink paddles and heat sink inserts thereon carry wafers through the ion beam, there are open regions between the individual heat sink paddles where wafer surface is not presented to the ion beam. This further reduces the overall heat load on the scan wheel assembly during the ion implantation process. This reduction in overall heat load enables substantially higher ion beam powers to be used with the scan wheel assembly of this invention than could possibly be achieved in prior art scan wheel designs in which the ion beam impinges on solid portions of the scan wheel throughout most of the scanning movement.

Figure 10:
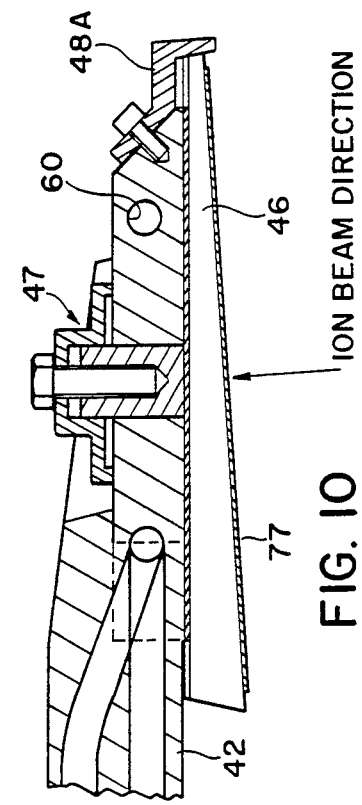
FIGS. 9 and 10 are partial section views of heat sink assemblies according to this invention.

Comparing FIG. 10 to FIG. 9, it will be seen that the heat sink insert 46 is designed so that it can be positioned either with the angled wafer mounting surface 77 canted toward the spoke arm section 42 as shown in FIG. 9 or canted away from the spoke arm section 42 as shown in FIG. 10. In the FIG. 10 mounting arrangement of the insert 46, a slightly modified wafer edge restraint 48A is provided to accommodate the different position of the outside edge of the wafer. The altered position of the heat sink insert 46 in FIG. 10 provides for a change in the implant angle of the ion beam relative to a wafer mounted on the surface of the elastomer layer 77. As will be discussed below, the orientation of the heat sink insert 46 in FIG. 9 provides for a 7-degree implant angle and the orientation of the heat sink insert in FIG. 10 provides for a 0-degree implant angle. By comparing FIG. 10 to FIG. 9, it will be seen that the ion beam direction relative to the mounting surface 70 of the heat sink paddle 45 remains unchanged. However, the reorientation of the heat sink element 46 having its mounting surface canted at 3½ degrees changes the implant angle by a total of 7 degrees between FIG. 9 and FIG. 10.

It should also be apparent from the structure of the heat sink insert 46 shown in FIG. 9 and the structure of the wafer edge clamp arrangement 49 shown in FIGS. 6 and 7, that the heat sink assemblies 31 of this invention can readily accommodate wafers of different diameter. As shown particularly in FIG. 7, the bracket 50 of the clamp arrangement 49 can be adjusted in position to accommodate different diameters of heat sink inserts 46. Different diameters of heat sink insert 46 can be accommodated on the heat sink paddle 45 with a simple change of the configuration of the edge restraint 48. It should also be apparent that the heat sink assembly 31 can be itself modified to accommodate different wafer sizes by altering the overall diameter of the heat sink paddle 45. The system of this invention can thus readily accommodate wafer diameters between three and eight inches. It may, however, not be possible to accommodate twenty-five eight-inch wafers without going to a larger process chamber.

Figure 12:
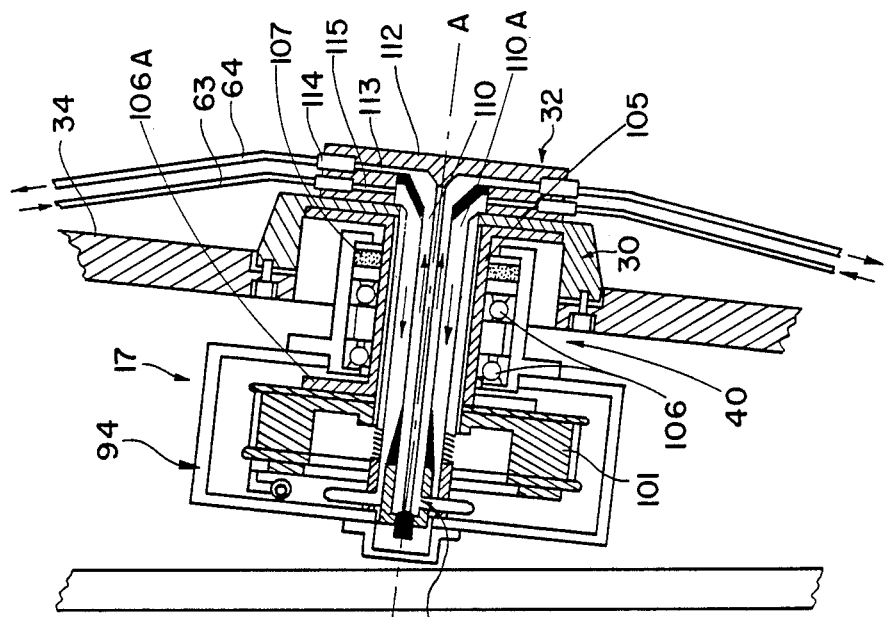
FIGS. 11 and 12 are section views illustrating mounting and drive arrangements for a scan wheel assembly according to this invention.
Figure 11:
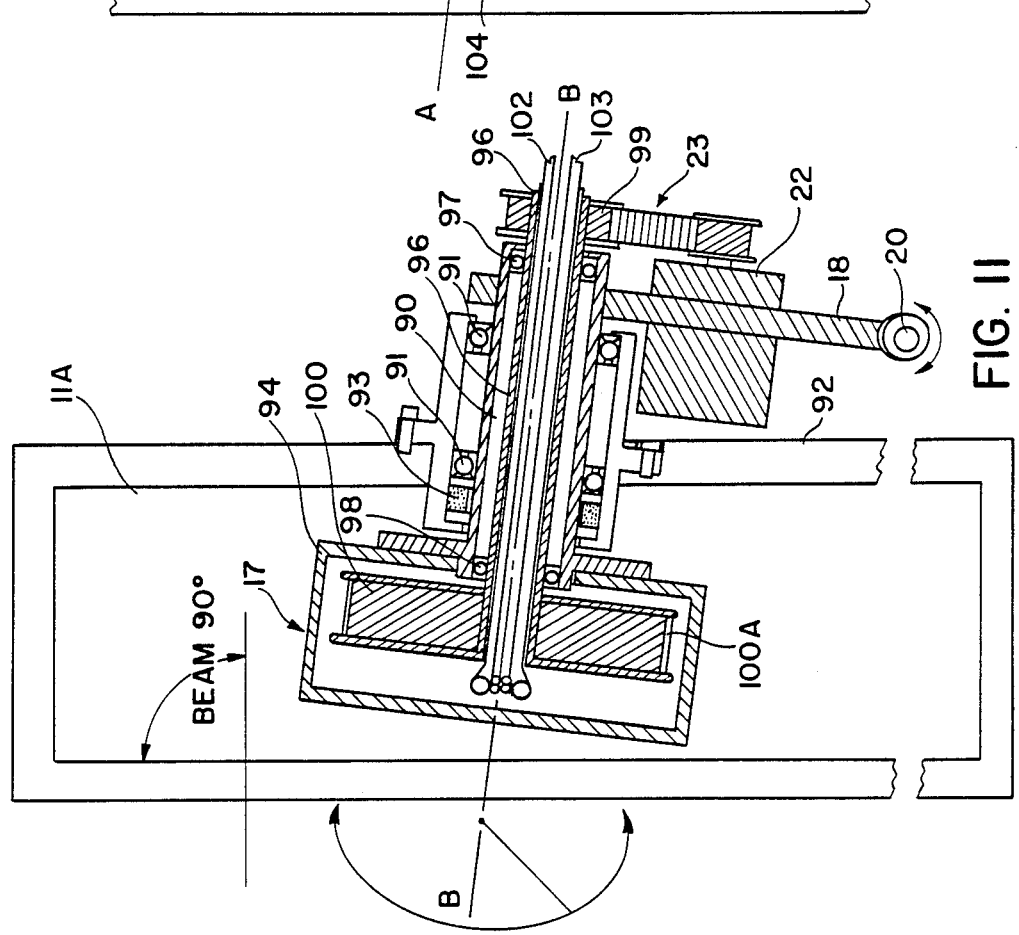

Referring now to FIGS. 11 and 12, the details of the respective mounting and drive arrangements of the scan arm 17 and scan wheel assembly 15 will be described. The scan drive arm 18 is carried on a hollow shaft 90 which is journaled in a load carrying bearing and rotary vacuum seal arrangement mounted to the front wall 92 of the vacuum chamber well 11A. Bearings 91 provide free shaft rotation, and rotating ferro-fluidic seal 93 surrounds the shaft 90 and provides an air-to-vacuum seal around the shaft to isolate the vacuum chamber well 11A from the ambient atmosphere outside the well. A hollow scan arm housing 94 is carried on the shaft 90 so as to rotate with the shaft. Accordingly, the screw drive arrangement 19 shown in FIG. 1 drives the drive arm 18 in rotation. The scan arm housing 94 of the scan arm assembly 17 rotates about the axis B, causing the upper end of the scan assembly carrying the scan wheel assembly 15 to move in a circular arc about the axis.

Figure 2:
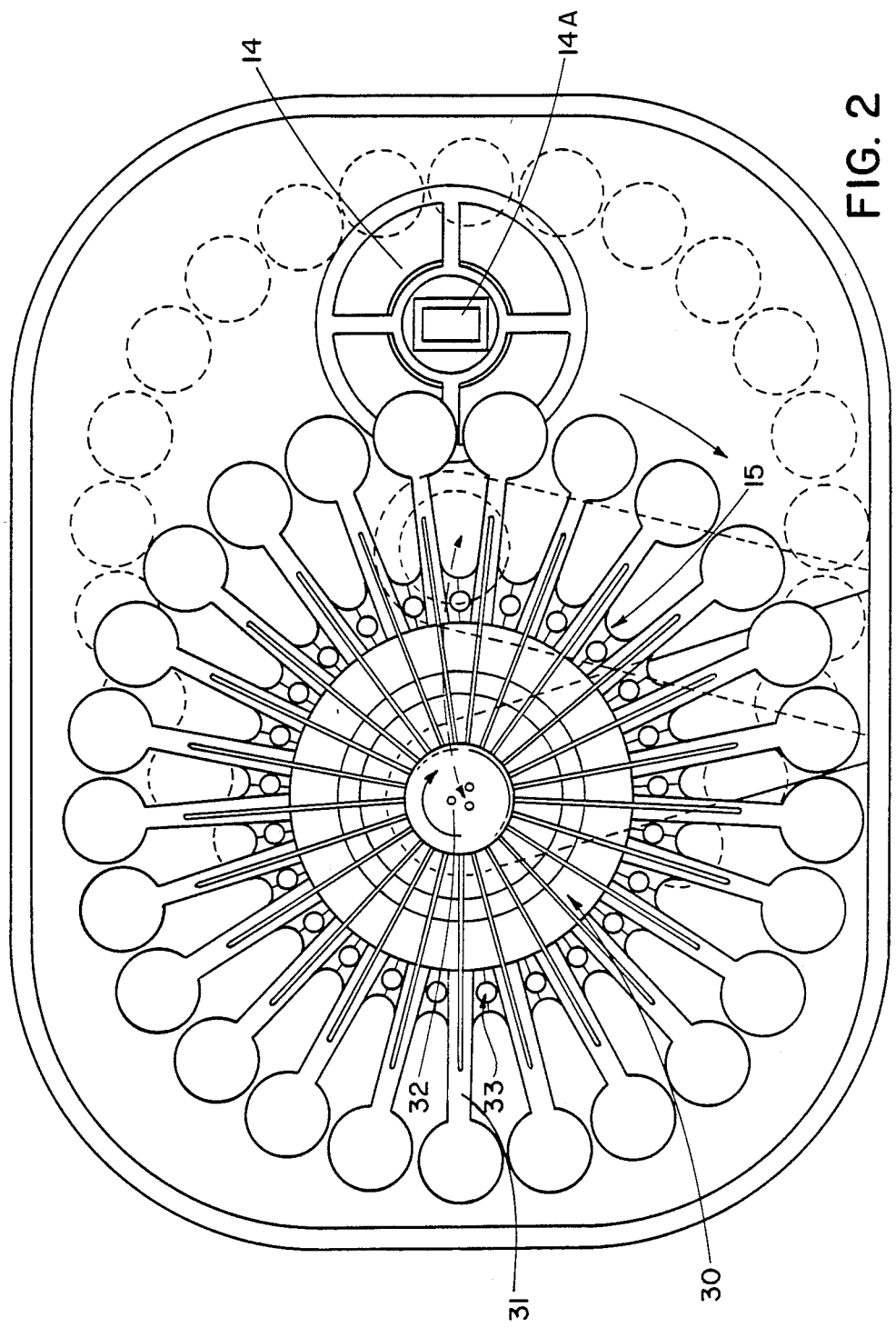
FIG. 2 is a front elevational view of a scan wheel assembly according to this invention.
Figure 8:
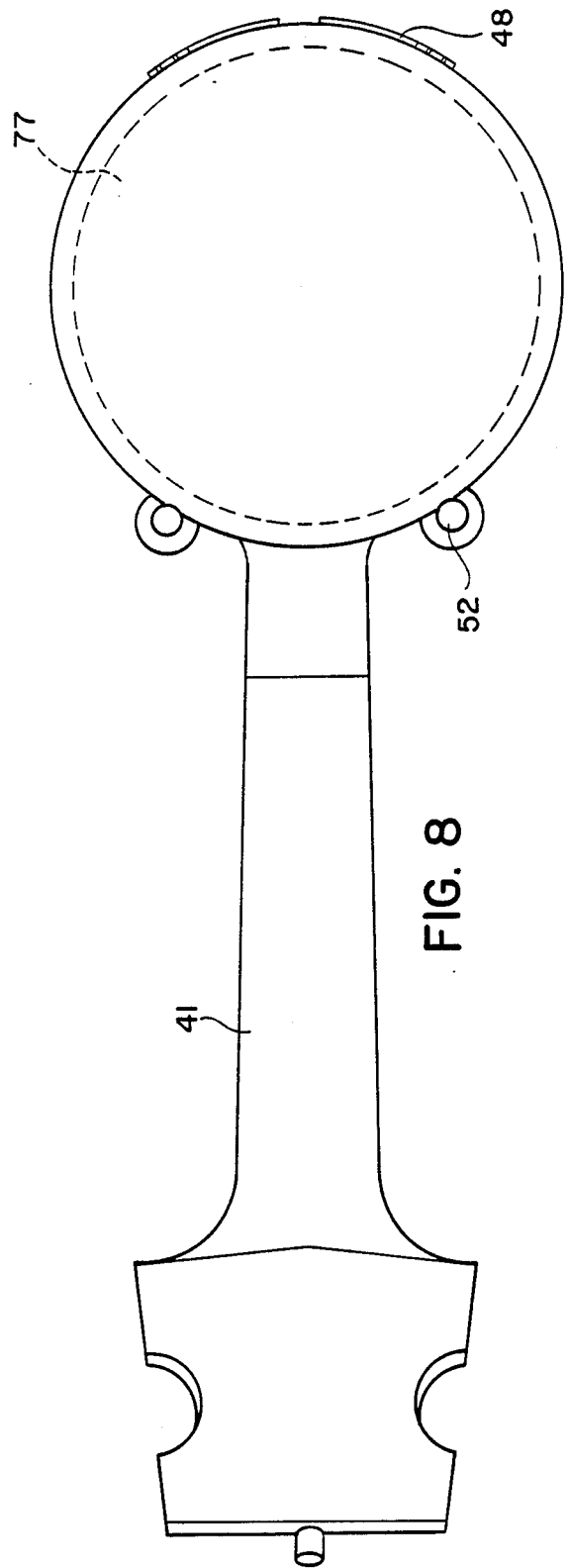

FIG. 11 also shows a portion of the preferred drive arrangement for the rotation of the scan wheel assembly 15 depicted in FIG. 12 and also depicted in FIGS. 1-3. A hollow drive shaft 96 is journaled in a bearing assembly 97 mounted within over end the hollow shaft 90 and a second bearing assembly 98 mounted within the other end of hollow shaft 90. This permits the hollow shaft 96 to rotate within and concentric to the hollow shaft 90. A belt drive wheel 99 is mounted to the hollow shaft 96 at one end adjacent the scan drive arm 18. A second belt drive wheel 100 is mounted on the other end of hollow shaft 96 within the scan arm housing 94. The belt drive wheel 99 forms one part of the overall scan wheel drive arrangement designated 23 in FIG. 1 and is driven as shown by a belt coupled to a drive wheel driven by the motor 22.

The arrangement of belt drive wheel 99, shaft 96, and belt drive wheel 100 transmits power for rotation of the scan wheel assembly 15 shown in FIG. 12 into the interior of the hollow scan arm housing 94. A drive belt 100A transmits the power from belt drive wheel 100 at the lower end of the scan arm assembly 17 to a belt drive wheel 101 at the upper end of the scan arm assembly 17 as depicted in FIG. 12. A pair of cooling fluid hoses 102 and 103 are fed through the hollow shaft 96 into the interior of the hollow drive arm housing 94 and couple inlet and return cooling fluid to a rotating header arrangement 104 mounted at the top of the drive arm assembly 17 shown in FIG. 12.

Referring now to FIG. 12, the remainder of the scan drive arrangement for the scan wheel assembly 15 will be described. Scan wheel assembly 15 in general and back support plate 34 in particular are carried on a hollow drive shaft 105 which is journaled for rotation about axis A in a bearing arrangement 106 mounted to the upper front wall of the scan arm housing 94. A ferro-fluidic vacuum to air seal arrangement 107 provides a rotary vacuum to air seal between the vacuum chamber 11 and the interior of the hollow shaft 105, and correspondingly to the interior of the hollow scan arm housing 94. Belt drive wheel 101 is mounted on hollow drive shaft 105 to provide the rotary drive power which causes the scan wheel assembly 15 to rotate at high rpm during the ion implantation process. A gear drive 106A drives an absolute digitizer to track wheel rotation.

The cooling water delivery arrangement 32 includes a hollow tube 110 which is mounted within the hollow drive shaft 105 in a concentric manner utilizing any convenient spacer positioning arrangement which permits passage of fluid through both the inner region of the tube in one direction and around the annular outside region between the hollow tube 110 and the drive shaft 105. The hollow tube 110 and the drive shaft 105 cooperate with a rotating seal arrangement in the header assembly 104 to provide water pressure to air sealing for the cooling fluid traversing the interior and annular coolant channels.

A fluid distribution block 112 is mounted on the front of the scan wheel hub 30 and includes a plurality of radially arrayed outlet fluid channels 114 which are in communication with the fluid delivery tubes 64 of the individual heat sink assemblies 31. A similar radial array of fluid coupling channels 115 communicate return fluid from the tubing 63 to the return fluid channel 110A. A coupling sealing arrangement such as that designated 114 couples the tubing 63 and 64 in a sealed manner into the distribution block 112.

Referring to FIG. 1 in conjunction with FIGS. 11 and 12, it will be apparent that the drive motor 22 provides high rpm driving power to belt drive wheel 99 which causes rotation of shaft 96 and corresponding rotation of belt drive wheel 100. This high rpm drive is coupled by way of a power transmission belt to belt drive wheel 101 in FIG. 12 which causes high rpm rotation of shaft 105 and all of scan wheel assembly 15.

It should be apparent from the above description that the combined high rotational velocity drive for the scan wheel assembly 15 and the slower processional scan drive for the scan arm assembly 17 are provided with the use of only rotary vacuum to air shaft seals which are very simple, effective arrangements to isolate ambient atmosphere from vacuum within the vacuum chamber 11. Typically the scan wheel assembly 15 will be rotated during an ion implantation operation at about 1,200-1,400 rpm. The scan arm assembly is typically precessed back and forth in a cycle which sends the individual heat sink paddles and wafers thereon back and forth through the ion beam at a rate of about two to twelve cycles per minute. The use of a rotary drive arrangement for the scan arm assembly 17 effectively eliminates the need for any type of translational vacuum to air sealing arrangements to provide the slow scan movement of the scan wheel assembly 15. The rotating ferro-fluidic vacuum to air seals are much less expensive and more effective and reliable than translational sealing arrangements used in some prior art systems. This enhances the overall simplicity and reliability of the dual scan drive system.

It should be understood that alternative arrangements could be provided for the high rpm drive of the scan wheel assembly 15. For example, an electric motor could be mounted directly within the hollow scan arm housing 94 with a substantially direct drive transmission to the shaft 105 carrying the scan arm assembly. However, since it is preferable and expedient to couple cooling fluid through hoses into the interior of the scan arm housing 94, the concentric drive arrangement utilizing hollow drive shaft 96 shown in FIG. 11 is an advantageous way of coupling scan wheel drive power to the interior of the hollow scan arm housing. In particular, this reduces the overall weight of the scan arm assembly 17 and reduces the overall moment of inertia about the axis A which must be overcome in reversing the drive direction of the scan wheel assembly and scan arm combination. External mounting of the drive motor is also preferred for purposes of ease of maintenance and repair as necessary.

Referring now to FIG. 13, important geometrical relationships of the scan wheel assembly and its mounting for rotation relative to the vacuum chamber and the direction of the ion beam will be described. This description is best taken using FIG. 13 in conjunction with FIGS. 3, 6, 9 and 10. As shown in FIGS. 3 and 13, the axis of rotation A of the scan wheel assembly 15 is canted relative to a line normal to the back wall of the vacuum chamber. More particularly, the axis A—A is canted at about 7 degrees relative to a line parallel to the ion beam direction. For purposes of this discussion, the ion beam direction will be assumed to define one coordinate of a rectangular coordinate system XYZ shown in FIG. 13 with the Y-axis of that coordinate system being defined by the ion beam direction. The X-axis of the rectangular coordinate system is perpendicular to the ion beam direction and the XY plane intersects both the ion beam direction line and the scan wheel axis of rotation A—A. It will be remembered that the axis of rotation A—A is describing a small arc of a circle as the scan arm assembly 17 rotates relative to the axis B—B. However, this change in the Z-coordinate position of the A—A axis of rotation can be ignored for practical purposes. What is important is that the 7-degree canting of the axis of rotation A—A puts that axis at a small acute angle to the Y-coordinate direction of the ion beam so that the A—A axis would intersect the ion beam direction at a large acute angle. It is this canting of the axis A—A which permits substantial centrifugal force to be provided normal to a wafer surface on the heat sink inserts even when a 0-degree implant angle is being utilized.

As shown in FIG. 13, the 7-degree canting of the axis A—A produces a corresponding 7-degree canting of the spoke arm section 41 relative to the X-axis or, in other words, relative to a line perpendicular to the ion beam. The heat sink paddle 45 is canted relative to the spoke arm 41 such that the mounting surface for the heat sink insert is canted relative to the spoke arm at about 10.5 degrees. Referring now to the heat sink insert 46A designated in FIG. 13, which corresponds to the position of the heat sink insert shown in FIG. 9, the wafer mounting surface 77 is canted at an additive 3.5-degree angle to the paddle such that the wafer mounting surface 77 is canted at a total 14-degree angle relative to the spoke arm 41. Since the spoke arm is canted at 7 degrees relative to the X-axis of the coordinate system, the 14-degree angle between the wafer mounting surface 77 and the spoke arm produces a 7-degree canting between the wafer mounting surface 77 and the XZ plane. This results in a 7-degree angle between the ion beam direction defining the Y-coordinate axis and a line normal to the wafer mounting surface 77 for a 7-degree implant angle of ions to a wafer on the wafer mounting surface 77.

In FIG. 13, 46B designates the opposite orientation of the heat sink insert 46 as shown in FIG. 10. Since the mounting surface of the heat sink paddle relative to the X-axis is 3½ degrees, the 3½ degree canting of the wafer mounting surface 77 in a subtractive sense places the wafer mounting surface 77 parallel to the XZ plane so that the ion beam direction is substantially normal to the wafer mounting surface 77 as shown in FIG. 13 and in FIG. 10. However, in each case of the heat sink orientation 46A and the orientation 46B shown in FIG. 13, the line normal to the wafer mounting surface 77 will intersect the axis of rotation A—A of the scan wheel assembly in a large acute angle. Thus a centrifugal force component normal to the wafer mounting surface is produced during rotation about axis A regardless of whether the beam implant angle is 7 degrees or 0 degrees.

FIGS. 14 and 15 illustrate the centrifugal force acting on a wafer on the heat sink. In the case shown in FIG. 14, the centrifugal force operates at an angle of 7 degrees relative to the plane of the wafer and thus has a substantial component of force which presses the wafer into the heat sink, or more specifically, into the elastomer pad on the heat sink. A larger component of the centrifugal force pushes the wafer against the edge restraint element 48A. Correspondingly, as shown in FIG. 15, when the implant angle is 7 degrees the centrifugal force on the wafer due to the high rotational velocity of the scan wheel assembly will be applied at an angle of 14 degrees to the plane of the wafer producing an even larger normal component of centrifugal force tending to press the wafer into the elastomer pad on the heat sink.

The geometric angles utilized in the embodiment of this invention depicted in the drawing figures discussed to this point and illustrated in FIG. 13 is only one case of the general concept of this invention. The general concept is that the axis of rotation A—A be canted toward the origin of the ion beam by a small acute angle generally in the plane defined by the ion beam direction and the axis of rotation. Canting of the axis of rotation in a different plane would also produce centrifugal force on the wafer normal to the heat sink mounting surface, but would not provide for a constant implant angle, as the scan wheel assembly rotates. The particular geometry shown in FIG. 13 is preferable to permit the same heat sink insert to be utilized in opposite mounting orientation for 7-degree and 0-degree implants. It should be apparent that this same result could be achieved under a 10-degree canting of the axis of rotation of the scan wheel assembly with an appropriate adjustment of the canting of the spoke arm relative to the main back plane 34 of the scan wheel assembly. If the axis A—A were canted at 10 degrees instead of 7 degrees shown in FIG. 13 and the spoke arms were canted at 13.5 degrees instead of the 10.5 degrees shown in FIG. 13, the heat sink inserts 46 could still be utilized for 7-degree and 0-degree implants in opposite orientations. The only difference then would be that a larger amount of vertical component of centrifugal force would be present to press the wafer against the heat sink in both the 7-degree and 0-degree implant situations. In the 0-degree implant the angle of centrifugal force on the wafer would be increased to 10 degrees and in the 7-degree implant situation the angle of application of centrifugal force on the wafer would be 17 degrees.

It will be appreciated, however, that while increases in centrifugal force normal to the wafer can be achieved by greater angles of canting of the axis of rotation, if one also maintains the same overall diameter of the scan wheel assembly, the depth of the vacuum chamber 11 must be increased to accommodate the increased angle. While some variation in the angle of canting of the axis A of the scan wheel can be utilized, it is preferable to maintain that angle at a small acute angle so that, in the rotational precession of the scan wheel assembly about the axis B—B, the distance between the wafer mounting surface and the ion beam exit from the post-acceleration tube 14 does not change drastically from one overscan position to the other. This could be important if the ion beam striking the wafer does not have a constant spot size, i.e., if all ions in the beam are not travelling substantially parallel to the Y-coordinate direction.

FIG. 16 illustrates that the general concepts of this invention could also be employed in a scan wheel assembly where different heat sink insert geometries are utilized to vary the implant angle between 7 degree and 0 degree. This shows the generality of this feature of the invention.

Figure 17:
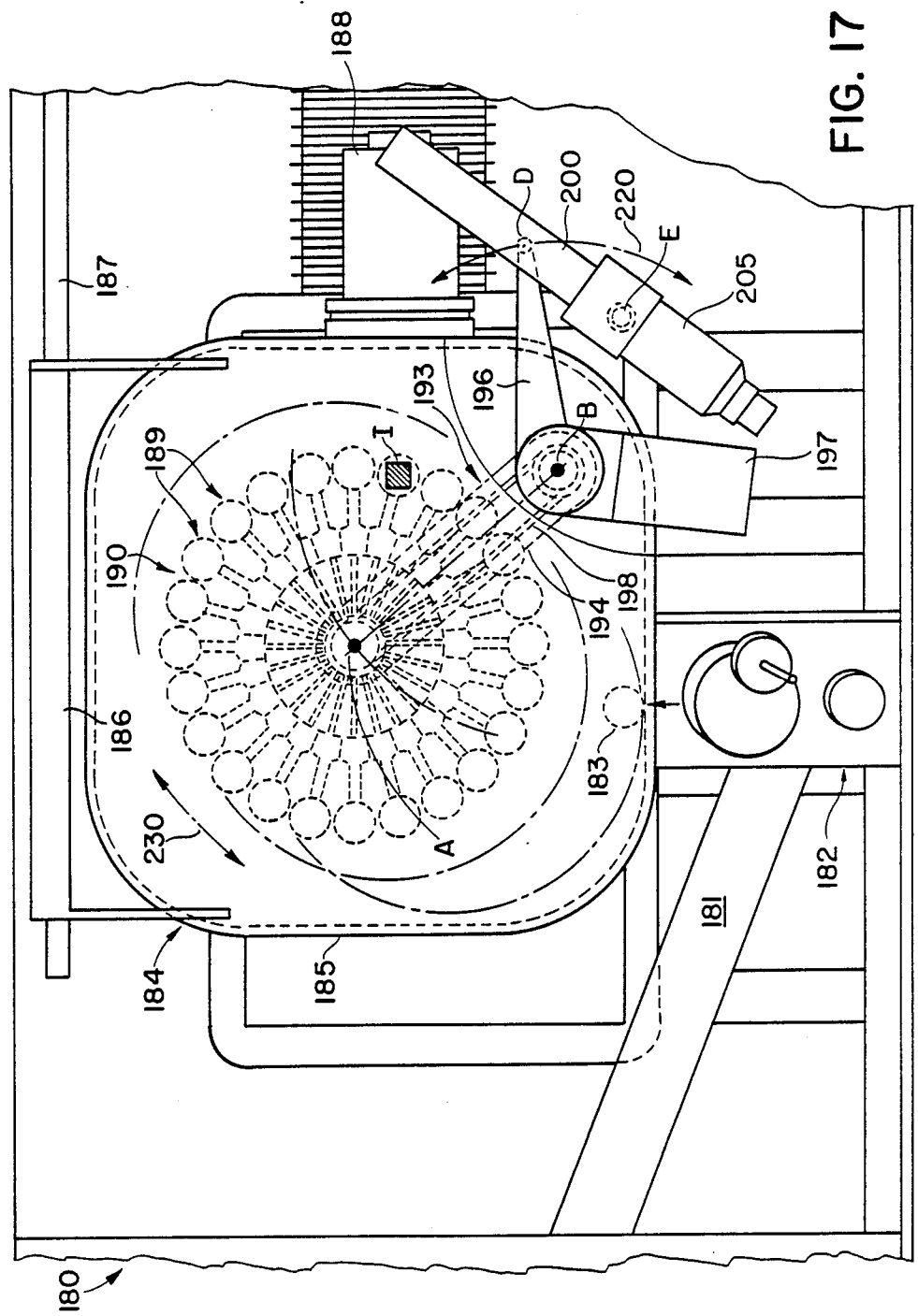
FIGS. 17 and 18 are front elevational and partial section views illustrating another embodiment of a wafer scanning system according to this invention.
Figure 18:
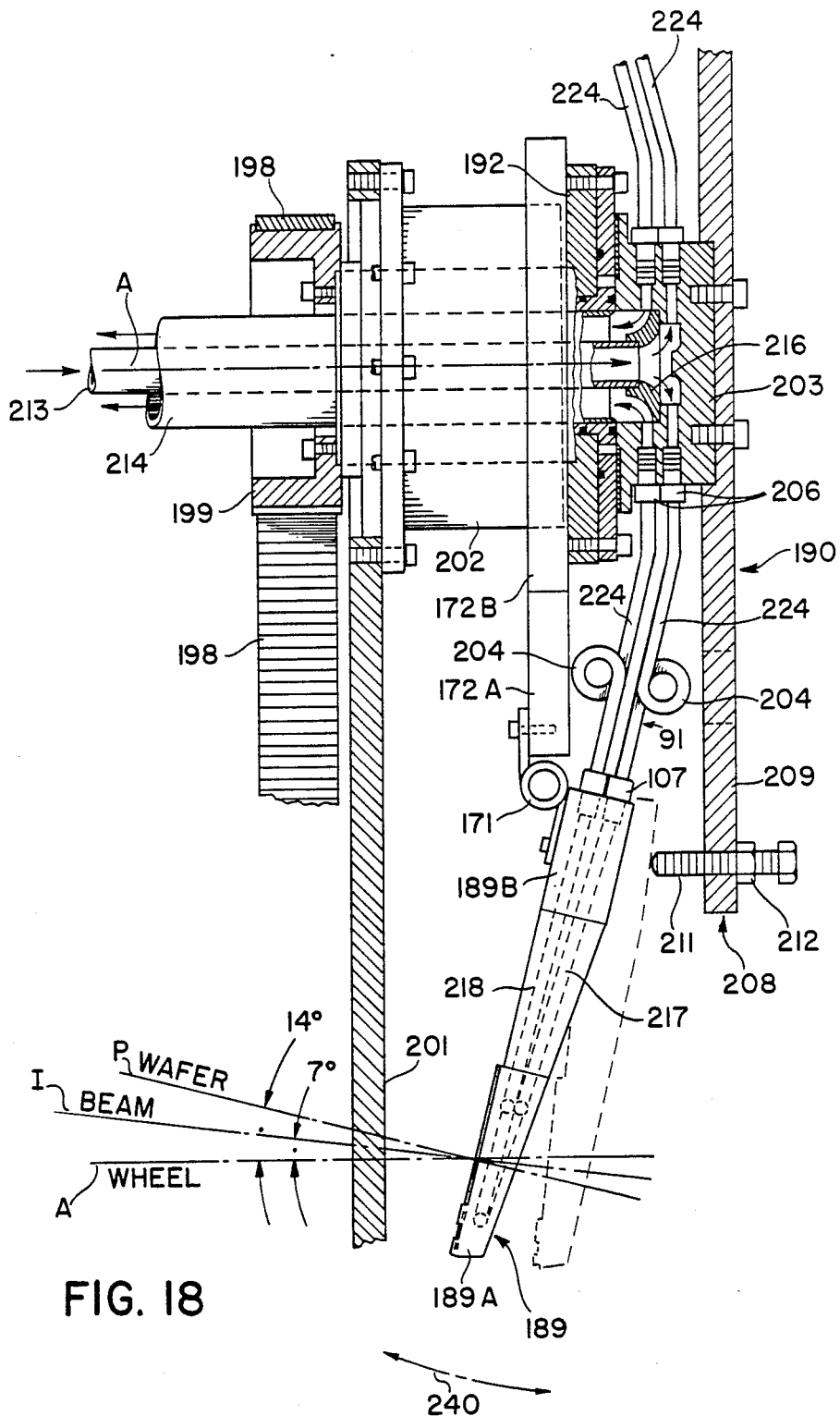

FIGS. 17 and 18 illustrate an alternative embodiment of this invention employing a smaller vacuum chamber and smaller scan wheel assembly which could be utilized for smaller wafer sizes. It will be appreciated that the general concepts of the invention are the same in this alternative embodiment, the general details of which are described below.

FIG. 17 shows an ion implantation system 180 which includes a cassette and wafer handling system (not shown) which automatically feeds cassettes along tunnel 181 to a load lock arrangement 182. This arrangement positions the wafer cassettes adjacent the wafer loading location 183 and serially loads and unloads wafers onto and from a scan scan wheel assembly 190. The scan scan wheel assembly is mounted within an ion implant vacuum chamber 184 for scanning movement, as described herein, relative to an ion beam, I, which is projected substantially perpendicular to, and out of the plane of, the drawing figure. As shown in FIG. 17, vacuum chamber 184 is sealed by door 185 so that operation of vacuum pump 188 is effective to evacuate the chamber to a desired low operating pressure. The door 185 is mounted on support assembly 186 for reciprocal opening and closing movement along slide 187 to provide access to the chamber 184.

The scan scan wheel assembly 190 comprises a plurality of wafer heat sink assemblies 89 which both support the individual wafers during rotational scanning and also are heat sinks for the wafers. As shown in FIG. 18, the heat sink assemblies 189 constitute a paddle-shaped wafer support 189A and an arm section 89B. The heat sink assemblies 189 are mounted via spring biased hinges 171 or the like to a wafer support base 172 which is attached to hub 192.

The base 172 can be configured in several alternative ways. For example, the base may constitute a circular plate, preferably of metal, such as aluminum, which is of light weight. Alternatively, and preferably where light weight is critical, the base 172 may constitute a base plate 72B which is joined to or integrally formed with a radial array of individual support arms 172A, one or more of which supports individual ones of the hinged heat sink assemblies 189. Hub 192 is mounted for radial scanning movement along an arc 230 under the control of a radial swing-arm assembly 193. Hub 192 is rotatably mounted within a scan arm housing 194 for rotation about hub axis A. The housing 194 is itself mounted for rotation on a shaft at point B for drive by a drive arm 96.

Housing 194 is a hollow scan arm with interior at atmospheric pressure. This facilitates heat removal, isolates particulates associated with the scan system from the vacuum chamber, and gives the option of mounting drive motor 197 at hub axis A. The scan arm drive arrangement and scan wheel drive arrangement together with mounting arrangements therefor are similar to the arrangements depicted in FIG. 11.

The scan wheel drive motor 197 is mounted adjacent pivot point B for driving a cog belt 198 or chain drive to rotate toothed pulley 199 (FIG. 18), wheel hub 192 and the scan wheel assembly 190. The pivot arm 196 is rigidly attached by a shaft to the housing 194 at a fixed angle thereto for reciprocally pivoting the hub 192 and the scan scan wheel assembly 190 about pivot point B. A linear scan arm drive 200 is mounted at fixed pivot point E and is attached to pivot arm 196 at pivot point D. Scan arm drive motor 205 reciprocates the scan arm drive 200 along path 220 to pivot the drive swing arm 196 and thereby effect reciprocal scanning movement of the hub 192 and scan wheel assembly along arc 230.

Other elements of the scan wheel assembly 190 are shown in FIG. 18. The wheel hub 192 and pulley 199 are cooperatively mounted by a ferro-fluidic rotary vacuum seal/bearing assembly 102 which is attached to chamber wall 101. Paddle support block 203 is mounted on top of the wheel hub 192. Coolant such as water is circulated to the wafer heat sink assemblies 189 via the flexure arms/tubes 191. In one embodiment, each arm 191 comprises a pair of stainless steel tubes 224. One end of each tube 224 is secured by fitting 206 to the support block 203 and the other end by fitting 207 to the associated paddle 189. When using the variable angle paddle mounting arrangement described below, each tube 224 is made flexible by a loop 204 incorporated therein. Alternatively, flexible tubing may be used in place of stainless steel tubing. Cooling water flow through the tubes and heat sink assemblies 189 is effected by fixed cooling water supply and return shafts 213 and 214. That is, water is supplied from a source (not shown) under pressure via fixed water supply shaft 213, is circulated via upper tube 224 through channel 217, then exits via channel 118, the lower tube 224 and return shaft 214. Annular seal 216 is mounted between the supply shaft 213 and the paddle support block 203 to separate the supply and return lines and to provide a rotating seal for the support block.

Pivotal mounting of the heat sink assemblies 189 provides for rotation of the individual heat sink assemblies 189. This movement is along arc or path 240 substantially transverse to the plane of the wheel assembly and results from the centrifugal force created by rotation of the scan wheel assembly 190. Adjustable stop assembly 208 includes a plate 209 and an adjustable stop screw 211 which is threaded therethrough and can be locked in a preselected position by lock nut 212. The adjustable stop screw 211 is used to select the position of the paddle along path 240, and thus, the angle of the paddle 189 (the plane of support section 189A) and wafer relative to the path, I, of the ion beam.

Referring back to FIGS. 1–3, it will be apparent that, as in prior art dual scan systems, 7 the geometrical factors regarding the slow scan and fast scan of the scan wheel assembly 15 are such that one or both of the fast scan speed or the slow scan speed must be varied during the slow scan cycle from one overscan position to the other. For uniformity of implant dose across the wafer surface, a uniform dwell time of each elmental surface area of the wafers in the ion beam during the overall ion implantation process must be achieved.

It will be appreciated that there are many ways that the slow scan arrangement of this invention could be implemented to achieve a 1/r velocity drive relation for the scan wheel where r is the distance from the center of the scan wheel to the fixed ion beam position. The preferred embodiment of this invention uses a congruent triangle mounting and drive arrangement for the scan arm which greatly simplifies the mechanical and electrical control aspects of the slow scan drive. This aspect of the invention can best be described in connection with the diagram shown in FIG. 19 together with the drawing in FIG. 1.

Figure 19:
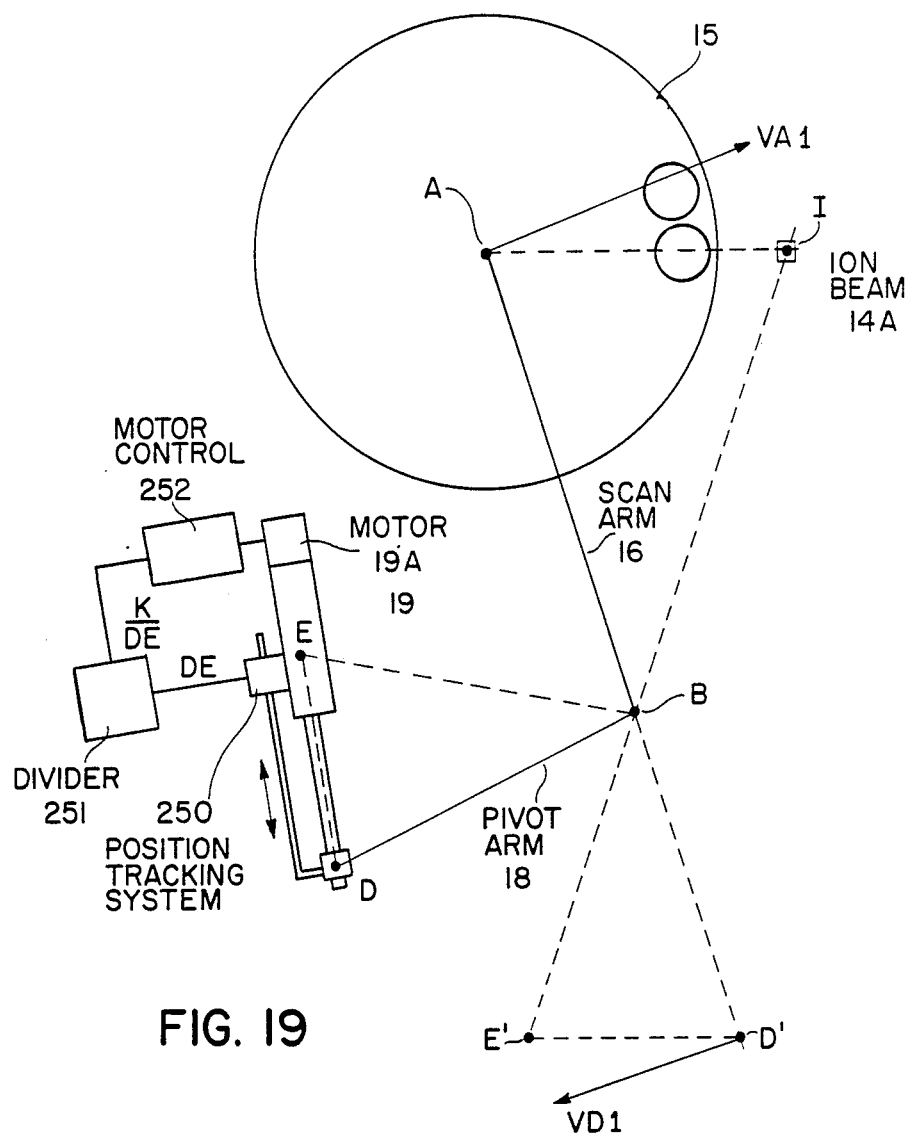
FIG. 19 is a schematic diagram of the slow scan control arrangement showing congruent triangle mounting and drive arrangements in accordance with this invention.

As shown in FIG. 19, the axis A of the scan wheel 15, the center of the ion beam I and the axis B of rotation of the scan arm 16 form a triangle BAI. In accordance with this invention, the length of the pivot arm 18 and the placement of the rotation point E for the linear drive arrangement 19 relative to the axis B are chosen such that the triangle BDE is congruent with the triangle BAI. This means that the included angles of each triangle are the same and the lengths of the sides are proportional.

This congruency of mounting relationships enables the drive of the point D toward the point E to be controlled in velocity as a function of the inverse of the distance DE such that the corresponding velocity of the point A in the direction of point I will be controlled as a function of the inverse of the distance AI. A position tracking system 250 tracks the distance DE and provides an output signal DE corresponding thereto. A divider circuit 251 converts the DE signal to a velocity control function signal K/DE where K is a variable constant determining the scan speed. This K/DE signal is fed to a motor control circuit 252 which controls the speed of motor 19A in accordance with the K/DE control function.

The congruent triangle mounting/drive relationship can more easily be understood by considering the congruent triangle BD'E' which is equivalent to moving the pivot arm 18 to be in alignment with the scan arm 16. This arrangement is fully equivalent from a geometric standpoint, but is not convenient to use in physical hardware for obvious reasons. As shown, the instantaneous velocity of the point D' is a vector VD1 and the instantaneous velocity of the point A is a vector VA1. It is the components of those vectors in the D'E' direction and AI direction which must have the 1/r (i.e. 1/AE) relationship.

Tracking the length D'E' and controlling the velocity of D' in the E' direction in accordance with that value automatically provides a velocity of scan in the D'E' direction which is inversely proportional to the value of D'E', and by congruency, is inversely proportional to the value of the distance AI. Thus, even through A and D each move in a cicular arc and the direction of their instantaneous velocity vectors is constantly changing, the tracking of the distance DE and controlling velocity as a function of 1/DE automatically compensates for changes in the direction of velocity vectors and gives control based on the vector component along the line between the axis A and the ion beam center I at any scan position.

One could obviously substitute a motor and gear arrangement to drive the scan arm 16 and use a complicated computer generated algorithm to control the speed of the motor to achieve the 1/r scan function. This arrangement would utilize the advantages of the mounting arrangement for the scan arm but would be more expensive to implement.

The ion implantation system depicted in FIG. 1 utilizes a high degree of sophisticated computer control of the ion beam line components and the wafer handling and wafer scanning assemblies utilized therein. Accordingly, it should be understood that monitoring and other signal lines may be coupled into the scan arm assembly 17 and computer control of both the fast scan motor 22 and the motor in the slow scan lead screw drive arrangement 19 can be provided to achieve overall automated control processing of a batch of semiconductor wafers to produce a specified implant dosage of a preselected ion species in each of the twenty-five wafers on the scan wheel assembly. This overall computer control may be integrated with dose monitoring arrangements which are facilitated by the scan wheel assembly design in that ion beam current levels can be monitored throughout substantially the entire dual scan cycle of the system. If necessary, the number of slow scan cycles and the speed of the scan cycles can be altered during the implant process to insure that the final target dose is implanted uniformly in the wafers in an integral number of slow scan cycles. Thus the overall computer control algorithm for the slow scan drive may involve many complex factors which will be readily understood and implemented by the skilled electronic and computer engineers with this sophisticated capability being enabled by the design concepts of this invention as described above.

It will be apparent from the above description of embodiments of this invention that all of the desired and required features for a wafer handling and scanning system in a very high current ion implantation system have been attained.

(1) Full batch scanning of twenty five wafers of diameter up to six inches is provided by the twenty five individual heat sink assemblies provided on the scan wheel assembly according to this invention.

(2) Uniformity of dose with less than 0.75% variation is readily achieved by accurate control of the fast and slow scan motions of the dual scan drive arrangements of this invention which are simple and reliable low inertia and low friction systems. The open area feature of scan wheel asembly design facilitates accurate real time current measurement, accurate measurement of accumulated dose, and reliable control of scan cycles for accuracy and uniformity in achieving the targeted final implant dose.

(3) Wafer temperatures less than 80 degrees Centigrade can be maintained at beam power of four kW due to the open geometry of the scan wheel assembly between spoke arms and wafer heat sink paddles and inserts together with water cooling channels in the heat sink paddles, providing effective heat transfer mechanisms between wafers and cooling fluid, including effective use of centrifugal force components normal to the wafer surface to avoid mechanical wafer clamping during implantation.

(4) Implant angle variation is avoided by the design of the heat sink assemblies with flat wafer mounting surfaces and the scan motion of the wafer scanning system.

(5) Contamination sources are substantially reduced by eliminating wafer edge clamps and avoiding translational vacuum-air sealing arrangements. All lubricated surfaces are outside the vacuum chamber. Minimum scan wheel surface area is intercepted by the ion beam during scanning to reduce sputtered contaminants.

(6) Mechanical and thermal stress damage to the wafer is virtually eliminated by avoiding wafer edge clamps that are difficult to cool and domed wafer mounting surfaces which produce mechanical stress.

(7) Total automation of wafer loading and unloading is facilitated since the scan wheel assembly and the individual heat sink paddles are readily positioned at a wafer transfer station near one side of the vacuum chamber. Computer controlled automation of the total implant process is also facilitated by the scan wheel assembly design features according to this invention and the drive arrangements therefor.

The combination of the design and operational features of a wafer scanning system according to this invention with the Aitken super high beam current technology, the automated wafer handling and loading system disclosed in the copending Stonestreet patent application and advanced, computer controlled automation features produces an ion implantation system with breakthrough levels of improvement in performance to meet the advanced requirements of the semiconductor industry.

It should be apparent from the above descriptions of various embodiments of this invention that persons of skill in the art represented by this invention could implement numerous changes and modifications without departing from the scope of this invention as claimed in the following claims.

What is claimed is:

1. In a system for scanning semiconductor wafers through an ion beam, means generating an ion beam oriented in a prearranged direction defining one axis of a rectangular coordinate system relative thereto; a scan wheel assembly for carrying a plurality of semiconductor wafers and having a central axis; drive means for rotating said scan wheel assembly about said central axis to scan said wafers across said ion beam generally in the direction of a second axis of said rectangular coordinate system; scan means for producing relative scanning movement between said scan wheel assembly and said ion beam generally in the direction of a third axis of said rectangular coordinate system; said scan wheel assembly comprising a central hub, a plurality of separate spoke arms mounted to and supported by said central hub and extending radially outward therefrom; and a plurality of heat sink elements, and said heat sink elements being supported on said spoke arms substantially without intervening structure; each supported on the outer end of one of said spoke arms and including means for mounting a semiconductor wafer thereon, said spoke arms each having a width substantially less than the maximum width of said heat sink elements; said scan means overscanning said heat sink elements in and out of said ion beam so that said ion beam strikes only a portion of said spoke arms in one overscan position and the total heat load produced on said scan wheel assembly by said ion beam is substantially reduced.

2. The system of claim 1, wherein said drive means comprises a mounting drive means for mounting said scan wheel assembly with said central axis generally parallel to the direction of said ion beam but canted at a slight angle toward the origin of said ion beam in a plane defined by said central axis and said one axis and for rotating said scan wheel assembly at high rotational velocity about said central axis to scan said wafers across said ion beam in one coordinate direction; each of said heat sink elements defining a mounting surface region and being spaced by an associated spoke arm at a prearranged distance from said central axis; each of said wafer mounting means comprising a heat sink insert mounted to said heat sink element and defining a wafer mounting surface for carrying a prearranged size of semiconductor wafer thereon and being oriented at a prearranged angle relative to said one axis such that a line normal to said wafer mounting surface in said plane defined by said central axis and said one axis intersects said central axis to define a large acute angle, whereby rotation of said scan wheel assembly at said high rotational velocity produces a substantial component of centrifugal force normal to said wafer mounting surface so that a wafer thereon is held tightly against said mounting surface when said scan wheel assembly is rotating at high rotational velocity.

3. The system of claim 2, wherein each of said heat sink elements defines a wafer edge restraint adjacent said heat sink insert at the outermost radial point thereon to restrain a wafer carried on said wafer mounting surface when said scan wheel assembly is in rotation; and further comprising wafer clamping means mounted on said heat sink element for temporarily urging a wafer carried on said wafer mounting surface against said wafer edge restraint when said scan wheel assembly is not rotating at high rotational velocity.

4. The system of claim 3, wherein said wafer clamping means includes a pair of clamp finger means, means mounting said clamp finger means to said heat sink element on a side opposite said wafer mounting surface and includng spring means urging said clamp finger means against an edge portion of a wafer carried on said wafer mounting surface and inertial means opposing said spring means when said scan wheel assembly is rotating at high velocity to retract said clamp finger means away from said edge portion of said wafer so that said wafer is retained on said wafer mounting surface solely by said component of centrifugal force normal to said wafer.

5. The system of claim 2, wherein said central axis of said scan wheel assembly is canted at an angle A relative to a line parallel to said one coordinate axis; each of said spoke arms having an outer arm portion canted with respect to said central hub by an angle B in the direction of the origin of said ion beam where B is equal to A plus 3.5 degrees; and each of said heat sink inserts has a first surface mounted on said heat sink element and a second surface comprising said wafer mounting surface defined at an angle of 3.5 degrees to said first surface; said heat sink inserts being selectably mountable on said heat sink element in one of a first orientation with said 3.5-degree angle additive to angle B to place said wafer mounting surface at an angle of 7 degrees to said ion beam or a second orientation with said 3.5-degree angle subtractive from angle B to place said wafer mounting surface at an angle of 0 degrees to said ion beam.

6. The system of claim 2, wherein each of said heat sink elements defines a cooling fluid channel therethrough; said scan wheel assembly includes piping means coupling cooling fluid to and from each of said cooling fluid channels in said heat sink assemblies to carry heat generated by said ion beam away therefrom; and each of said heat sink inserts comprises a conductive metal body defining a first mounting surface adjacent said heat sink assembly and a second mounting surface facing said ion beam, a first layer of conductive elastomeric material mounted on said first mounting surface, and a second layer of conductive elastomeric material mounted on said second mounting surface to serve as said wafer mounting surface, whereby said heat sink insert provides good thermal conductivity to said cooled heat sink assembly across the entire surface of a wafer mounted thereon when said scan wheel assembly is rotated at high velocity to produce said component of centrifugal force urging said wafer against said second layer of conductive elastomeric material.

7. The system of claim 6, wherein each of said heat sink elements defines a wafer edge restraint adjacent said heat sink insert at the outermost radial point thereon to restrain said wafer on said wafer mounting surface when said scan wheel assembly is in rotation; and further comprising wafer clamping means mounted on said heat sink element for temporarily urging a wafer carried on said wafer mounting surface against said wafer edge restraint when said scan wheel assembly is not rotating at high rotational velocity; said wafer clamping means includes a pair of clamp finger means, means mounting said clamp finger means to said heat sink element on a side opposite said wafer mounting surface and including spring means urging said clamp finger means against an edge of a wafer carried on said wafer mounting surface and inertial means opposing said spring means when said scan wheel assembly is rotating at high velocity to retract said clamp finger means away from said edge of said wafer so that said wafer as retained on said wafer mounting surface solely by said component of centrifugal force normal to said wafer.

8. The system of claim 1, further comprising a vacuum chamber for housing said scan wheel assembly and having front and back walls generally parallel to the plane of said scan wheel assembly, wherein said drive means and said scan means comprise a combined mounting drive means for mounting said scan wheel assembly in said vacuum chamber with said central axis oriented substantially parallel to said one axis, for rotating said scan wheel assembly about said central axis, and for translating said scan wheel assembly relative to said ion beam substantially in the direction of a second axis of said rectangular coordinate system to produce a two dimensional scan of said semiconductor wafer through said ion beam; said mounting drive means comprising a scan arm disposed within said vacuum chamber, first mounting means for mounting said scan wheel assembly at one end of said scan arm for rotation about said central axis, first drive means associated with said first mounting means for rotationally driving said scan wheel assembly, second mounting means for mounting said scan arm at the other end thereof for rotation about an axis generally parallel to said one axis including shaft means attached at one end to said scan arm and extending through said front wall of said vacuum chamber, bearing means external to said vacuum chamber for journaling said shaft means for rotation, second drive means associated with said shaft means for rotating said shaft in said bearing means, and vacuum sealing means cooperatively mounted between said wall of said vacuum chamber and said shaft means to provide a rotary vacuum-to-air shaft sealing arrangement.

9. The system of claim 8, wherein said mounting drive means mounts said scan wheel assembly with said central axis generally parallel to the direction of said ion beam but canted at a slight angle toward the origin of said ion beam in a plane defined by said central axis and said one axis; each of said heat sink elements defining a mounting surface region and being spaced by an associated spoke arm at a prearranged distance from said central axis; each of said wafer mounting means comprising a heat sink insert mounted to said heat sink element and defining a wafer mounting surface for carrying a prearranged size of semiconductor wafer thereon and being oriented at a prearranged angle relative to said one axis such that a line normal to said wafer mounting surface in said plane defined by said central axis and said one axis intersects, said central axis to define a large acute angle, whereby rotation of said scan wheel assembly at said high rotational velocity produces a substantial component of cenrifugal force normal to said wafer mounting surface so that a wafer thereon is held tightly against said mounting surface during said rotational scanning.

10. The system of claim 9, wherein each of said heat sink elements defines a wafer edge restraint adjacent said heat sink insert at the outermost radial point thereon to restrain a wafer carried on said wafer mounting surface when said scan wheel assembly is in rotation; and further comprising wafer clamping means mounted on said heat sink element for temporarily urging a wafer carried on said wafer mounting surface against said wafer edge restraint when said scan wheel assembly is not rotating at high rotational velocity.

11. The system of claim 10, wherein said wafer clamping means includes a pair of clamp finger means, means mounting said clamp finger means to said heat sink element on a side opposite said wafer mounting surface and including spring means urging said clamp finger means against an edge of a wafer carried on said wafer mounting surface and inertial means opposing said spring means when said scan wheel assembly is rotating at high velocity to retract said clamp finger means away from said edge of said wafer so that said wafer is retained on said wafer mounting surface solely by said component of centrifugal force normal to said wafer.

12. The system of claim 9, wherein said central axis of said scan wheel assembly is canted at an angle A relative to a line parallel to said one axis; each of said spoke arms having an outer arm portion canted with respect to said hub by an angle B in the direction of the origin of said ion beam where B is equal to A plus 3.5 degrees; and each of said heat sink inserts has a first surface mounted on said heat sink element and a second surface comprising said wafer mounting surface defined at an angle of 3.5 degrees to said first surface; said heat sink inserts being selectably mountable on said heat sink element in one of a first orientation with said 3.5-degree angle additive to angle B to place said wafer mounting surface at an angle of 7 degrees to said ion beam or a second orientation with said 3.5-degree angle subtractive from angle B to place said wafer mounting surface at an angle of 0 degrees to said ion beam.

13. The system of claim 9, wherein each of said heat sink elements defines a cooling fluid channel therethrough; said scan wheel assembly includes piping means coupling cooling fluid to and from each of said cooling fluid channels in said heat sink assemblies to carry heat generated by said ion beam away therefrom; and each of said heat sink inserts comprises a conductive metal body defining a first mounting surface adjacent said heat sink assembly and a second mounting surface facing said ion beam, a first layer of conductive elastomeric material mounted said first mounting surface, and a second layer of conductive elastomeric material mounted on said second mounting surface to serve as said wafer mounting surface, whereby said heat sink insert provides good thermal conductivity to said cooled heat sink assembly across the entire surface of a wafer mounted thereon when said scan wheel assembly is rotated at high velocity to produce said component of centrifugal force urging said wafer against said second layer of conductive elastomeric material.

14. The system of claim 9, wherein each of said heat sink elements defines a wafer edge restraint adjacent said heat sink insert at the outermost radial point thereon to restrain said wafer on said wafer mounting surface when said scan wheel assembly is in rotation; and further comprising wafer clamping means mounted on said heat sink element for temporarily urging a wafer on said wafer mounting surface against said wafer edge restraint when said scan wheel assembly is not rotating at high rotational velocity; said wafer clamping means includes a pair of clamp finger means, means mounting said clamp finger means to said heat sink element on a side opposite said wafer mounting surface and including spring means urging said clamp finger means against an edge of a wafer carried on said wafer mounting surface and inertial means opposing said spring means when said scan wheel assembly is rotating at high velocity to retract said clamp finger means away from said edge of said wafer so that said wafer is retained on said wafer mounting surface solely by said component of centrifugal force normal to said wafer.

15. In a system for scanning semiconductor wafers through an ion beam, a vacuum chamber; means generating an ion beam and directing said ion beam into said vacuum chamber in a prearranged direction defining one axis of a rectangular coordinate system; a scan wheel assembly for carrying a plurality of semiconductor wafers and having a central axis; mounting drive means for mounting said scan wheel assembly in said vacuum chamber with said central axis oriented substantially parallel to said one axis, for rotating said scan wheel assembly about said central axis, and for translating said scan wheel assembly relative to said ion beam substantially in the direction of a second axis of said coordinate system to produce a two dimensional scan of said semiconductor wafer through said ion beam; said mounting drive means comprising a scan arm disposed within said chamber, first mounting means for mounting said scan wheel assembly at one end of said scan arm for rotation about said central axis, first drive means associated with said first mounting means for rotationally driving said scan wheel assembly, second mounting means for mounting said scan arm at the other end thereof for rotation about an axis generally parallel to said one axis including shaft means attached at one end to said scan arm and extending through a wall of said vacuum chamber, bearing means external to said vacuum chamber for journaling said shaft means for rotation, second drive means associated with said shaft means for rotating said shaft in said bearing means, and vacuum sealing means cooperatively mounted between said vacuum chamber wall and said shaft means to provide a rotary vacuum to air shaft sealing arrangement.

16. The system of claim 15, wherein said axis of said ion beam I, said central axis of said scan wheel assembly A and said axis of said second mounting means B intersect a common orthogonal plane at points which define a triangle BAI having two fixed sides BA and BI and a third side AI which varies in length as said scan arm scans back and forth across said beam; said second drive arrangement comprising means for driving said scan arm so that the rate of change of the distance AI varies inversely with the magnitude of the distance AI, including a pivot arm mounted at one end to said shaft and a linear drive means mounted for rotation about an axis E and attached to the other end of said pivot arm at a point D so that said linear drive means translates said other end of said pivot arm toward said axis E; the positions of said axis E and said point of attachment D being preselected such that said points B, D, and a point on said axis E coplanar with points B, D define a triangle BDE which is congruent to said triangle BAI; said second drive arrangement further including tracking means for signalling the distance DE as said linear drive means moves said pivot arm, and means for controlling the rate of drive of said linear drive means as a function of the inverse of said signalled distance DE so that the rate of change of the distance DE varies inversely with the magnitude of the distance DE and, because of triangular congruency, the corresponding rate of change of the distance AI varies inversely with the magnitude of the distance AI.

17. In a system for scanning semiconductor wafers through an ion beam, means generating an ion beam oriented in a prearranged direction defining one axis of a rectangular coordinate system relative thereto; a scan wheel assembly for carrying a plurality of semiconductor wafers and having a central axis; mounting drive means for mounting said scan wheel assembly with said central axis generally parallel to the direction of said ion beam but canted at a slight angle toward the origin of said ion beam in a plane defined by said central axis and said axis and for rotating said scan wheel assembly at high rotational velocity about said central axis to scan said wafers across said beam generally in the driection of a second axis of said coordinate system; said scan wheel assembly including wafer mounting means comprising structural means defining a plurality of separate mounting surface regions disposed at radially arrayed locations spaced a prearranged distance from said central axis and a wafer support assembly mounted at each of said mounting surface regions and defining a flat wafer mounting surface having a prearranged angle relative to said one axis such that a line normal to said wafer mounting surface in said plane defined by said central axis and said one coordinate axis intersects said central axis to define a large acute angle, whereby rotation of said scan wheel assembly at said high rotational velocity produces a substantial component of centrifugal force normal to said wafer mounting surface so that a wafer thereon is held tightly against said mounting surface during said rotational scanning.

18. In a method for scanning semiconductor wafers through an ion beam, the steps of:
   disposing a plurality of generally cylindrical heat sinks radially around a central hub with narrow spokes connecting said heat sinks to said central hub and rotatably mounting said hub on a scan arm itself mounted for pivotal movement about a selected point spaced from the hub;
   mounting a plurality of individual wafers on said heat sink elements;
   rotating said heat sinks and wafers around said central hub at a high velocity; and
   pivoting said scan arm to scan said heat sinks and wafers back and forth through said beam with a velocity which varies proportional to 1/r where r is the distance between said ion beam and said central hub.

19. In a method for scanning semiconductor wafers through an ion beam, the steps of:
   disposing a plurality of wafer mounting surfaces on a scan wheel with each at a common prearranged first angle to a major plane of said scan wheel;
   mounting said scan wheel for rotation about an axis which is canted toward the origin of said ion beam direction by a small acute angle which is of value equal to or less than said first angle; and
   rotating said scan wheel about said axis at high angular velocity to provide a component of centrifugal force normal to said wafer surface even when said second angle is equal to said first angle.

20. In a method for scanning semiconductor wafers through an ion beam, the steps of:
   mounting said wafers on prearranged radially arrayed positions on a scan wheel;

mounting said scan wheel for rotation about a central axis thereof on one end of a scan arm;

mounting the other end of said scan arm for rotation about a scan axis generally parallel to said central axis and generally parallel to said ion beam;

mounting a pivot arm at one end to said scan arm to drive said scan arm about said scan axis; and translating the other end of said pivot arm toward a fixed point in space which, together with said other end of pivot arm and a point on said scan axis coplanar therewith, defines a triangle which is congruent with a triangle defined by points on said scan axis, said central axis and said ion beam in a plane mutually orthogonal thereto, said translating being at a velocity which is inversely proportional to the distance between said other end of said pivot arm and said fixed point so that said central axis of said scan wheel translates toward said ion beam with a velocity between said central axis and said ion beam which is inversely proportional to the distance therebetween because of said congruency.

21. In a system for scanning a semiconductor wafer through an ion beam, a scan wheel;

means mounting said scan wheel for rotation about a central axis generally parallel to said ion beam;

means for driving said scan wheel to a high rotational velocity in a plane generally parallel to the direction of gravitational forces;

a heat sink element carried on said scan wheel and defining a mounting surface for carrying a semiconductor wafer on said heat sink, said mounting surface being disposed at a prearranged angle to said central axis such that a line normal to said mounting surface intersects said central axis to form a small acute angle;

restraining means mounted adjacent said mounting surface for restraining a wafer carried thereon from flying off said mounting surface due to a high value component of centrifugal force on said wafer in the plane of said wafer during high rotational velocity of said scan wheel; and means for temporarily retaining said wafer on said mounting surface while said scan wheel is at rest or is spinning up toward high rotational velocity, said wafer being held tightly against said mounting surface by a component of centrifugal force normal to said wafer during high rotational velocity of said scan wheel.

22. The system of claim 21, wherein said restraining means includes at least one wafer clamping means comprising clamp finger means, mounting means mounting said clamp finger means adjacent said wafer mounting surface including spring means urging said clamp finger means into contact with an edge portion of a wafer carried on said mounting surface in the absence of centrifugal force on said mounting means and inertial means responsive to centrifugal force on said mounting means during high rotational velocity of said scan wheel to overcome said spring means and thereby to retract said clamp finger means away from said edge portion of said wafer.

23. In a system for scanning semiconductor wafers through an ion beam, means generating an ion beam oriented in a prearranged direction defining one axis of a rectangular coordinate system relative thereto; a scan wheel assembly for carrying a plurality of semiconductor wafers and having a central axis; drive means for rotating said scan wheel assembly about said central axis to scan said wafers accross said ion beam generally in the direction of a second axis of said rectangular coordinate system; scan means for producing relative scanning movement between scan wheel assembly and said ion beam generally in the direction of a third axis of said rectangular coordinate system; said scan wheel assembly comprising a central hub, a plurality of separate spoke arms mounted to and supported by said central hub and extending radially outward therefrom; and a plurality of heat sink elements, each supported on the outer end of one of said spoke arms and including means for mounting a semiconductor wafer thereon, said spoke arms each having a width substantially less than the maximum width of said heat sink elements; said scan means overscanning said heat sink elements in and out of said ion beam so that said ion beam strikes only a portion of said spoke arms in one overscan position and the total heat load produced on said scan wheel assembly by said ion beam is substantially reduced; and wherein said drive means comprises a mounting drive means for mounting said scan wheel assembly with said central axis generally parallel to the direction of said ion beam but canted at a slight angle toward the origin of said ion beam in a plane defined by said central axis and said one axis and for rotating said scan wheel assembly at a high rotational velocity about said central axis to scan said wafers accross said ion beam in one coordinate direction; each of said heat sink elements defining a mounting surface region and being spaced by an associated spoke arm at a prearranged distance from said central axis; each of said wafer mounting means comprising a heat sink insert mounted to said heat sink element and defining a wafer mounting surface for carrying a prearranged size of semiconductor wafer thereon and being oriented at a prearranged angle relative to said one axis such that a line normal to said wafer mounting surface in said plane defined by said central axis and said one axis intersects said central axis to define a large acute angle, whereby rotation of said scan wheel assembly at said high rotational velocity produces a substantial component of centrifugal force normal to said wafer mounting surface so that a wafer thereon is held tightly against said mounting surface when said scan wheel assembly is rotating at high rotational velocity.

* * * * *

UNITED STATES PATENT AND TRADEMARK OFFICE
CERTIFICATE OF CORRECTION

PATENT NO. : 4,733,091

DATED : March 22, 1988

INVENTOR(S) : Frederick J. L. Robinson et al

It is certified that error appears in the above-identified patent and that said Letters Patent is hereby corrected as shown below:

IN THE SPECIFICATION

In Col. 4, line 41, change "resolve" to --revolve--.

In Col. 11, line 56, change "scan are assembly 15" to --scan arm assembly 15--.

IN THE CLAIMS

In Claim 3, Col. 21, line 67, after the dependency "Claim 2", insert --or 23--.

In Claim 5, Col. 22, line 22, after the dependency "Claim 2", insert --or 23--.

In Claim 6, Col. 22, line 40, after the dependency "Claim 2", insert --or 23--.

Signed and Sealed this

Fifteenth Day of November, 1988

Attest:

DONALD J. QUIGG

*Attesting Officer*     *Commissioner of Patents and Trademarks*

UNITED STATES PATENT AND TRADEMARK OFFICE
CERTIFICATE OF CORRECTION

PATENT NO. : 4,733,091
DATED : March 22, 1988
INVENTOR(S) : FREDERICK J. L. ROBINSON ET AL It is certified that error appears in the above-identified patent and that said Letters Patent is hereby corrected as shown below:

<u>IN THE SPECIFICATION</u>

In Col. 6, line 61, change "congruent" to --similar--;

In Col. 7, line 13, change "congruent" to --similar--;

In Col. 7, line 21, change "congruency" to --similarity--;

In Col. 8, line 20, change "congruent" to --similar--;

In Col. 18, line 58, change "congruent" to --similar--;

In Col. 19, line 3, change "congruent" to --similar--;

In Col. 19, line 7, change "congruency" to --similarity--;

In Col. 19, line 21, change "congruent" to --similar--;

In Col. 19, lines 22 and 23, change "congruent" to --similar--; and

In Col. 19, line 37, change "congruency" to --similarity--.

UNITED STATES PATENT AND TRADEMARK OFFICE
CERTIFICATE OF CORRECTION

PATENT NO. : 4,733,091
DATED : March 22, 1988
INVENTOR(S) : FREDERICK J. L. ROBINSON ET AL It is certified that error appears in the above—identified patent and that said Letters Patent is hereby corrected as shown below:

<u>IN THE CLAIMS</u>

In Claim 16, Col. 25, line 62, change "congruent" to --similar--;

In Claim 16, Col. 26, line 2, change "congruency" to --similarity--;

In Claim 20, Col. 27, lines 11 and 12, change "congruent" to --similar--; and

In Claim 20, Col. 27, line 21, change "congruency" to --similarity--.

Signed and Sealed this

Seventeenth Day of January, 1989

*Attest:*

DONALD J. QUIGG

*Attesting Officer*   Commissioner of Patents and Trademarks